(12) United States Patent
Park et al.

(10) Patent No.: US 11,488,860 B2
(45) Date of Patent: Nov. 1, 2022

(54) INTEGRATED CIRCUIT DEVICE AND METHOD OF MANUFACTURING THE SAME

(71) Applicant: Samsung Electronics Co., Ltd., Suwon-si (KR)

(72) Inventors: Su-jeong Park, Hwaseong-si (KR); Dong-chan Lim, Hwaseong-si (KR); Kwang-jin Moon, Hwaseong-si (KR); Ju-bin Seo, Seongnam-si (KR); Ju-Il Choi, Seongnam-si (KR); Atsushi Fujisaki, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 173 days.

(21) Appl. No.: 16/938,259

(22) Filed: Jul. 24, 2020

(65) Prior Publication Data

US 2020/0357690 A1 Nov. 12, 2020

Related U.S. Application Data

(63) Continuation of application No. 16/242,122, filed on Jan. 8, 2019, now Pat. No. 10,763,163.

(30) Foreign Application Priority Data

Jul. 19, 2018 (KR) .................. 10-2018-0084274

(51) Int. Cl.
*H01L 23/48* (2006.01)
*H01L 21/768* (2006.01)

(52) U.S. Cl.
CPC .. *H01L 21/76843* (2013.01); *H01L 21/76805* (2013.01); *H01L 21/76814* (2013.01); *H01L 21/76898* (2013.01); *H01L 23/481* (2013.01)

(58) Field of Classification Search
CPC .................. H01L 21/76898; H01L 23/481
See application file for complete search history.

(56) References Cited

U.S. PATENT DOCUMENTS

| 6,797,642 | B1 | 9/2004 | Chu et al. |
| 6,992,012 | B2 | 1/2006 | Hashim et al. |
| 7,416,974 | B2 | 8/2008 | Arakawa |
| 7,638,423 | B2 | 12/2009 | Lee et al. |

(Continued)

FOREIGN PATENT DOCUMENTS

| EP | 1848031 A1 | 10/2007 |
| EP | 2634795 A1 | 9/2013 |

(Continued)

OTHER PUBLICATIONS

Extended European Search Report dated Nov. 26, 2019, issued in corresponding European Application No. 19184154.3.

*Primary Examiner* — Daniel P Shook
(74) *Attorney, Agent, or Firm* — Harness, Dickey & Pierce, P.L.C.

(57) ABSTRACT

An integrated circuit device includes a substrate, a landing pad on the substrate, and a through-via structure passing through the substrate and connected to the landing pad. The through-via structure may include a conductive plug, a first conductive barrier layer covering a sidewall and a lower surface of the conductive plug, and a second conductive barrier layer covering a sidewall of the first conductive barrier layer.

23 Claims, 21 Drawing Sheets

(56) References Cited

U.S. PATENT DOCUMENTS

| | | |
|---|---|---|
| 7,651,941 B2 | 1/2010 | Ishigami |
| 8,354,751 B2 | 1/2013 | Horak et al. |
| 8,779,559 B2 | 7/2014 | Ramachandran et al. |
| 2012/0119384 A1 | 5/2012 | Takii et al. |
| 2014/0070426 A1 | 3/2014 | Park et al. |
| 2018/0068949 A1 | 3/2018 | Chen et al. |

FOREIGN PATENT DOCUMENTS

| | | | |
|---|---|---|---|
| JP | 2004-153162 A | 5/2004 | |
| JP | 2007-335578 A | 12/2007 | |
| JP | 4242136 B2 | 3/2009 | |
| JP | 5352534 B2 | 11/2013 | |
| JP | 2014-229667 A | 12/2014 | |
| JP | 5873145 B2 | 3/2016 | |
| WO | WO-2018123299 A1 * | 7/2018 | ......... H01L 21/3065 |

* cited by examiner

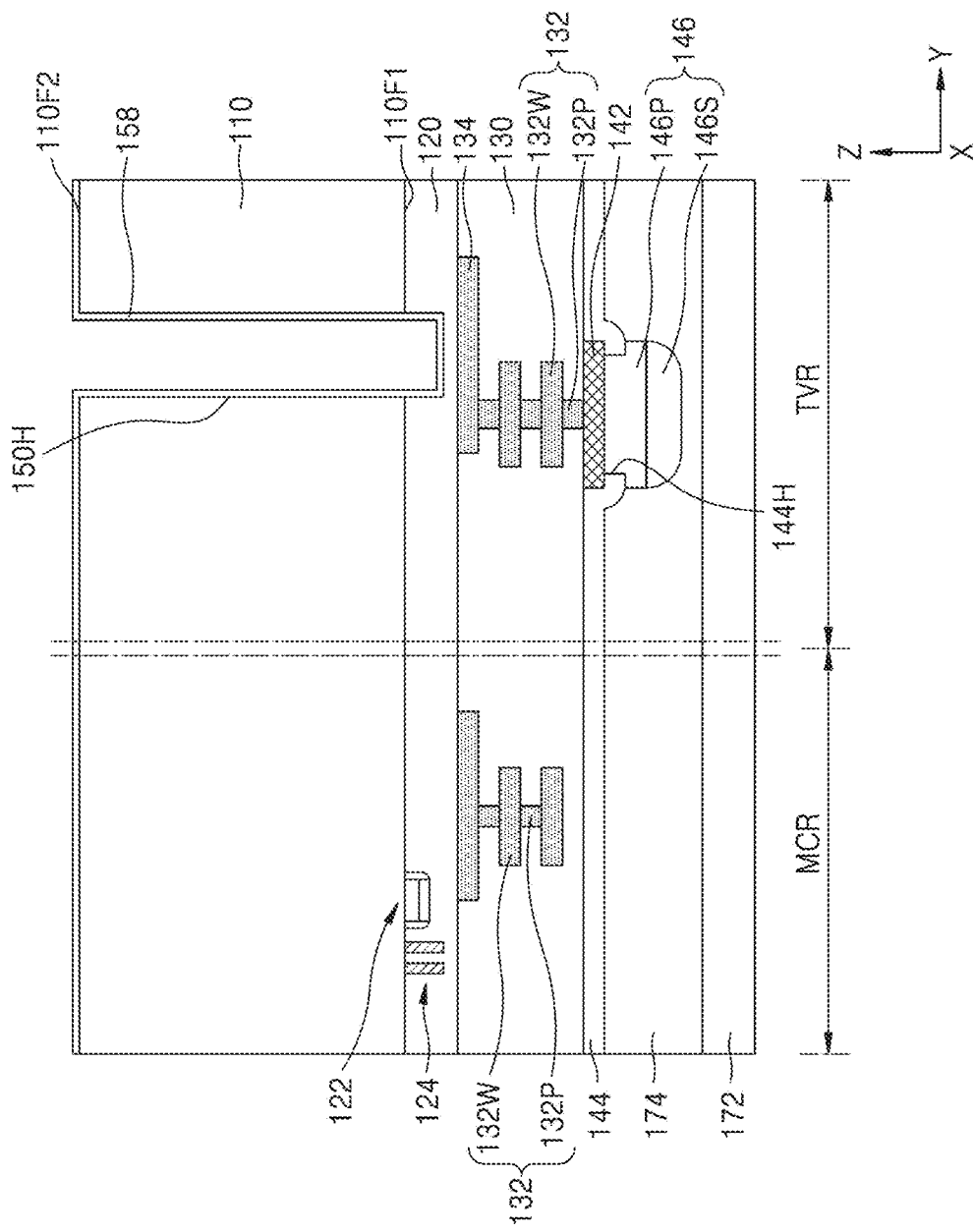

INTEGRATED CIRCUIT DEVICE AND METHOD OF MANUFACTURING THE SAME

CROSS-REFERENCE TO RELATED APPLICATION

This application is a continuation of U.S. application Ser. No. 16/242,122, filed Jan. 8, 2019, and claims priority under 35 U.S.C. § 119 to Korean Patent Application No. 10-2018-0084274 filed on Jul. 19, 2018 in the Korean Intellectual Property Office, the disclosure of each of which is hereby incorporated by reference in its entirety.

TECHNICAL FIELD

Example embodiments of the present disclosure relate to an integrated circuit device and a method of manufacturing the same, and more specifically, to an integrated circuit device including a through-silicon-via (TSV) structure and a method of manufacturing the same.

DISCUSSION OF RELATED ART

As a three-dimensional package in which a plurality of semiconductor chips are mounted in a single package has been developed, a reliable connection structure using a through-silicon-via (TSV) structure extending through a substrate or a die to form a vertical electrical connection may be necessary.

SUMMARY

According to example embodiments of inventive concepts, an integrated circuit device may include a substrate, a landing pad on the substrate, and a through-via structure passing through the substrate. The through-via structure may be connected to the landing pad. The through-via structure may include a conductive plug, a first conductive barrier layer covering a sidewall and a lower surface of the conductive plug, and a second conductive barrier layer covering a sidewall of the first conductive barrier layer.

According to example embodiments of inventive concepts, an integrated circuit device may include a substrate, an interlayer insulation layer on the substrate, a landing pad on the interlayer insulation layer, and a through-via structure. The interlayer insulation layer and the substrate may define a through-via hole that penetrates the substrate and the interlay insulation layer. The through-via structure may be in the through-via hole and may be connected to the landing pad. The through-via structure may include a conductive plug, a first conductive barrier layer on a sidewall and a lower surface of the conductive plug, and a second conductive barrier layer on a sidewall of the first conductive barrier layer.

According to example embodiments of inventive concepts, an integrated circuit device may include a substrate, a landing pad on the substrate, and a through-via structure passing through the substrate and connected to the landing pad. The through-via structure may include a conductive plug, a first conductive barrier layer on a sidewall and a lower surface of the conductive plug, a second conductive barrier layer on a sidewall of the first conductive barrier layer, and a via insulation layer on a sidewall of the second conductive barrier layer and being spaced apart from the landing pad.

BRIEF DESCRIPTION OF THE DRAWINGS

FIGS. 8, 9, 10, 11A, 11B, 12A, 12B, 13A, 13B, 14A, 14B, 15, and 16 are cross-sectional views illustrating operations in a method of manufacturing an integrated circuit device according to example embodiments.

DETAILED DESCRIPTION

Various example embodiments will now be described more fully with reference to the accompanying drawings in which some example embodiments are shown. However, inventive concepts may be embodied in many alternate forms and should not be construed as limited to only example embodiments set forth herein.

Figure 1:
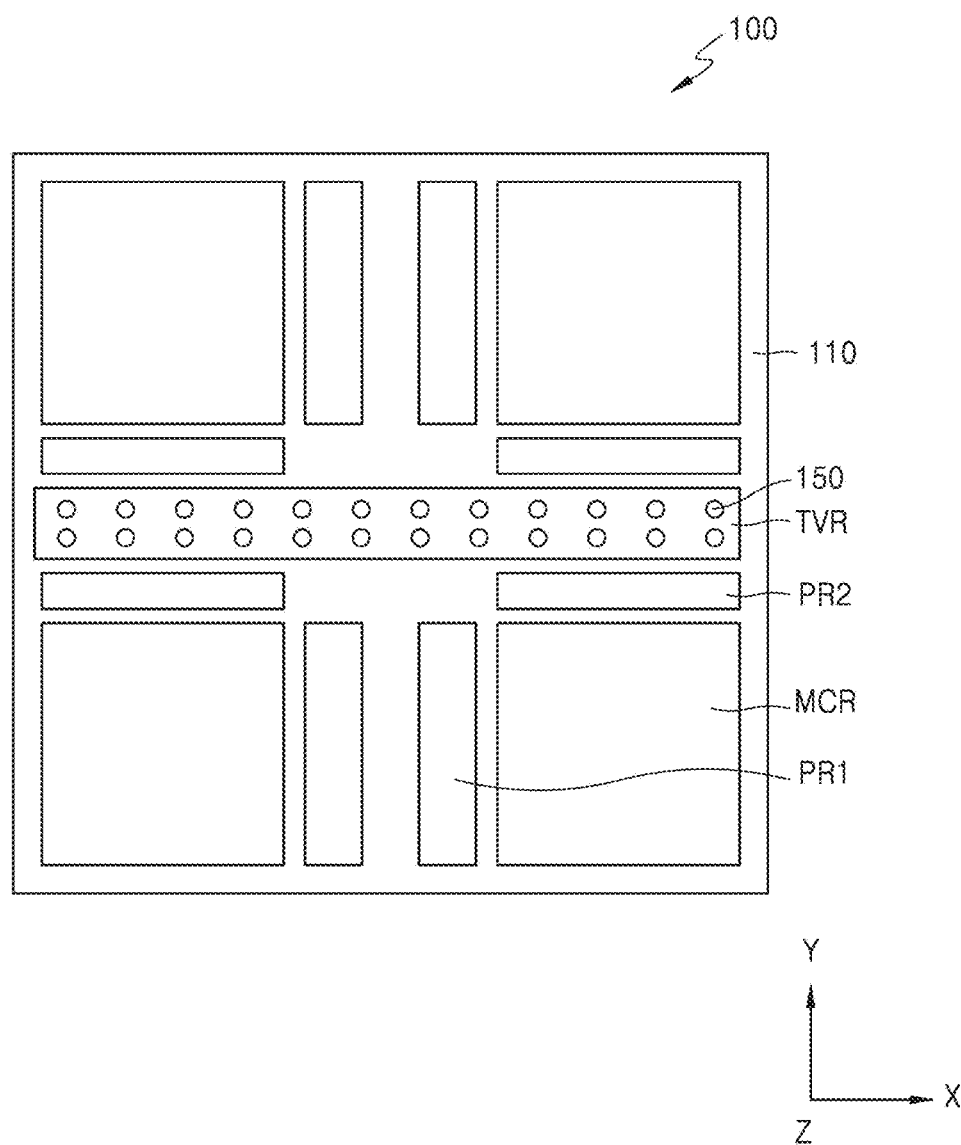
FIG. 1 is a plan view illustrating an integrated circuit device according to example embodiments.
Figure 2:
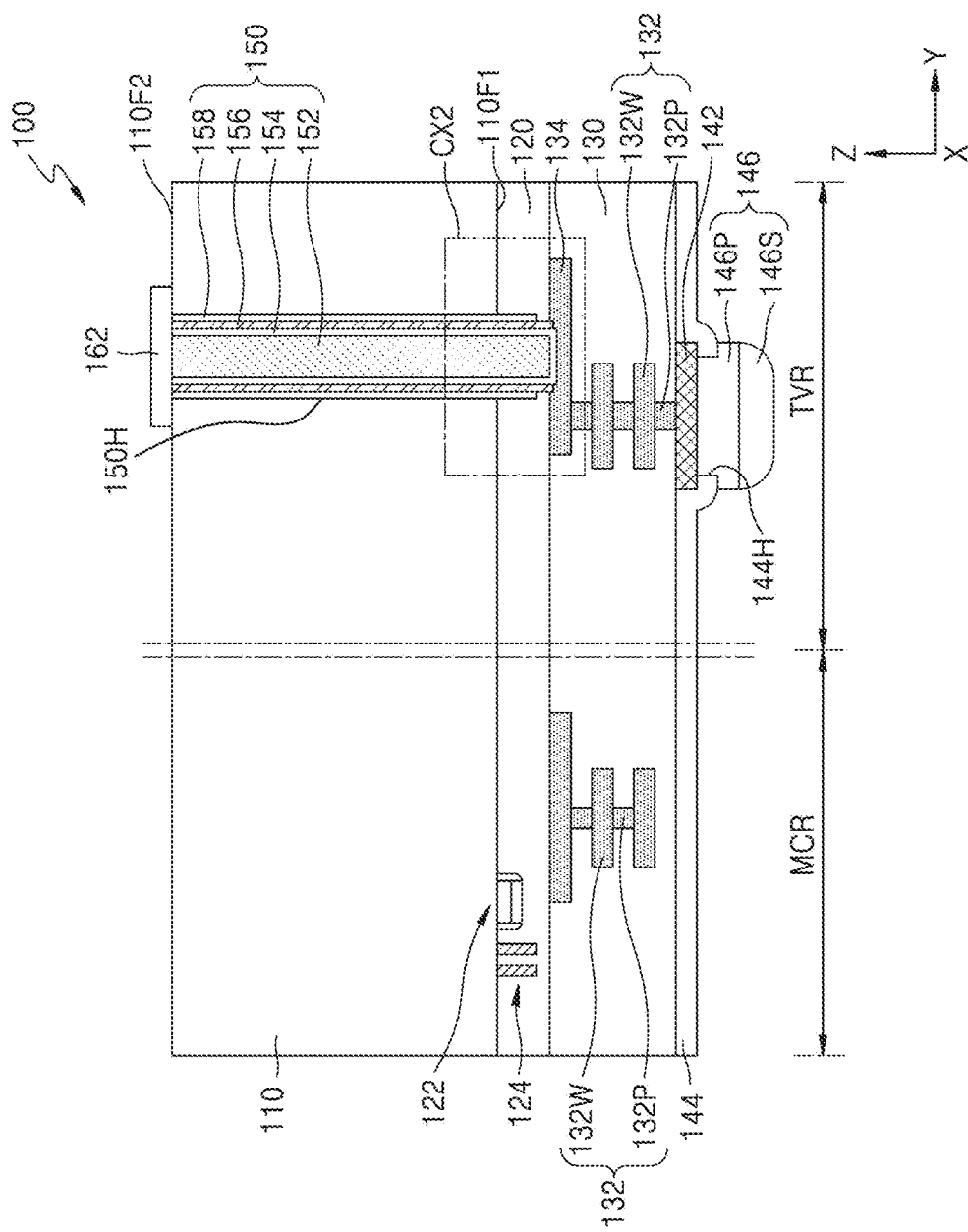
FIG. 2 is a cross-sectional view illustrating a portion of a main cell region MCR and a portion of a through-via region TVR of FIG. 1.
Figure 3:
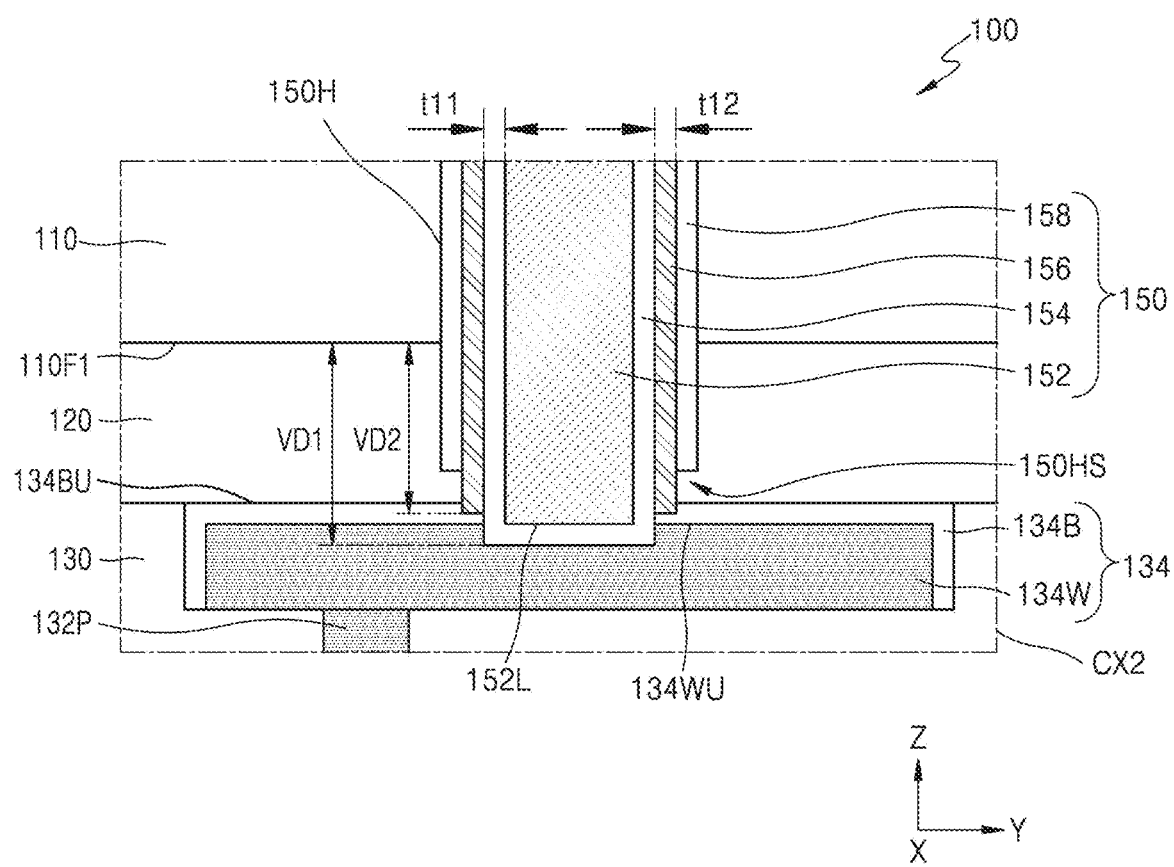
FIG. 3 is an enlarged view of portion CX2 of FIG. 2.

FIG. 1 is a plan view illustrating an integrated circuit device 100 according to example embodiments. FIG. 2 is a cross-sectional view illustrating a portion of a main cell region MCR and a portion of a through-via region TVR of FIG. 1. FIG. 3 is an enlarged view of portion CX2 of FIG. 2.

Referring to FIGS. 1 to 3, the integrated circuit device 100 may include a substrate 110 including a plurality of main cell regions MCR and a through-via region TVR.

As an example, a plurality of memory cells may be disposed in each of the plurality of main cell regions MCR. A first peripheral circuit region PR1 may be disposed atone side of each of the main cell regions MCR, and a second peripheral circuit region PR2 may be disposed at another side of each of the main cell regions MCR. For example, a row decoder may be disposed in the first peripheral circuit region PR1 to be connected to the memory cells disposed in each of the main cell regions MCR, and a column decoder may be disposed in the second peripheral circuit region PR2 to be connected to the memory cells disposed in each of the main cell regions MCR. In some embodiments, other driving devices, such as a control logic circuit, a sense amplifier, and/or a page buffer, for driving the memory cells may be disposed in the first and second peripheral circuit regions PR1 and PR2.

A plurality of through-via structures 150 may be disposed in the through-via region TVR to pass through the substrate 110. A signal may be received from or be transmitted to an external terminal through the through-via structure 150.

In some embodiments, an arrangement of the main cell regions MCR. the first and second peripheral circuit regions PR1 and PR2, and the through-via region TVR, shown in FIG. 1 may be modified. For example, the main cell region MCR may be disposed in a central region of the substrate 110, and the first and second peripheral regions PR1 and PR2 and the through-via region TVR may be disposed to surround the main cell region MCR in plan view.

The substrate 110 may have a first surface 110F1 and a second surface 110F2 that are opposite to each other. The substrate 110 may include a semiconductor substrate including silicon, germanium, silicon carbide, gallium arsenide, indium arsenide, or indium phosphide. In some embodiments, the substrate 110 may have a silicon on insulator (SOI) structure. For example, the substrate 110 may include a buried oxide (BOX) layer. In some embodiments, the substrate 110 may include various isolation structures, such as a shallow trench isolation (STI) structure.

An interlayer insulation layer 120 may be disposed on the first surface 110F1 of the substrate 110. The interlayer insulation layer 120 may cover a plurality of semiconductor devices 122 and a wiring structure 124. The plurality of semiconductor devices 122 may include a memory device, such as a DRAM, a PRAM, a flash memory, or an ReRAM, a metal oxide semiconductor filed effect transistor, a system large scale integration (LSI), an image sensor, such as a CMOS image sensor (CIS), a micro electro mechanical system (MEMS), an active device, and/or a passive device. The semiconductor devices 122 may be electrically connected to the wiring structure 124. A structure including the interlayer insulation layer 120, and the semiconductor devices 122 and the wiring structure 124 covered by the interlayer insulation layer 120 may refer to a front-end-of-line (FEOL) structure.

An inter-metal insulation layer 130 may be disposed on the interlayer insulation layer 120. The inter-metal insulation layer 130 may cover a multilayer wiring structure 132 disposed on the interlayer insulation layer 120. The multilayer wiring structure 132 may include a plurality of wiring layers 132M and a plurality of wiring vias 132P. In some embodiments, the inter-metal insulation layer 130 may have a stack structure of multiple insulation layers, and each of the multiple insulation layers may cover portions of the plurality of wiring layers 132M and portions of the plurality of wiring vias 132P. A structure including the inter-metal insulation layer 130 and the multilayer wiring structure 132 covered by the inter-metal insulation layer 130 may refer to a back-end-of-line (BEOL) structure.

A landing pad 134 may be disposed on the interlayer insulation layer 120. At least a portion of the landing pad 134 may be covered by the inter-metal insulation layer 130. The landing pad 134 may be a portion of the multilayer wiring structure 132 disposed in the through-via region TVR.

Referring to FIG. 3, the landing pad 134 may include a landing pad metal layer 134W and a landing pad barrier layer 134B. The landing pad barrier layer 134B may cover an upper surface 134WU and a sidewall of the landing pad metal layer 134W. Here, among opposite surfaces of the landing pad barrier layer 134B extending in a horizontal direction (e.g., an X direction and a Y direction), a surface of the landing pad barrier layer 134B closer to the interlayer insulation layer 120 or the substrate 110 may refer to an upper surface 134BU of the landing pad barrier layer 134B. In addition, a surface of the landing pad metal layer 134W extending in the horizontal direction (e.g., the X direction and the Y direction) and facing the interlayer insulation layer 120 may refer to the upper surface 134WU of the landing pad metal layer 134W, and another surface of the landing pad metal layer 134W opposite to the upper surface 134WU of the landing pad metal layer 134W may refer to a lower surface of the landing pad metal layer 134W.

In some embodiments, the landing pad metal layer 134W may include Ni, Cu, Al, Au, W, or a combination thereof, but is not limited thereto. The landing pad barrier layer 134B may include at least one of W, WN, WC, Ti, TiN, Ta, TaN, Ru, Co, Mn, WN, Ni, or NiB, but is not limited thereto.

A first pad 142 may be disposed on the inter-metal insulation layer 130. A passivation layer 144 including an opening 144H exposing at least a portion of an upper surface of the first pad 142 may be disposed on the inter-metal insulation layer 130. The first pad 142 may include Al, Ni, Cu, or a combination thereof. The passivation layer 144 may include polyimide and/or silicon nitride.

A bump structure 146 may be disposed on the first pad 142. The bump structure 146 may include a pillar 146P and a solder layer 146S that are sequentially stacked on the first pad 142. For example, the pillar 146P may include Cu, Ni, or an alloy thereof, and the solder layer 146S may include Sn, Ag, Pb, Au, Cu, B, or an alloy thereof.

Referring to FIG. 2, the first pad 142 and the bump structure 146 may be disposed in the through-via region TVR. In some embodiments, the first pad 142 and the bump structure 146 may be optionally further disposed in the main cell region MCR.

The through-via structure 150 may pass through the substrate 110 and the interlayer insulation layer 120 to be connected to the landing pad 134. For example, when the substrate 110 is a silicon substrate, the through-via structure 150 may be a through-silicon-via (TSV) structure. The through-via structure 150 may include a conductive plug 152, a first conductive barrier layer 154, a second conductive barrier layer 156, and a via insulation layer 158.

The through-via structure 150 may be disposed in a through-via hole 150H passing through the substrate 110 and the interlayer insulation layer 120. The through-via hole 150H may extend from the second surface 110F2 of the substrate 110 to the first surface 110F1 of the substrate 110 and penetrate the interlayer insulation layer 120. The via insulation layer 158, the second conductive barrier layer 156, the first conductive barrier layer 154, and the conductive plug 152 may be sequentially disposed on an inner sidewall of the through-via hole 150H.

The conductive plug 152 may extend through substrate 110 and the interlayer insulation layer 120. A lower surface 152L of the conductive plug 152 may be positioned at a lower level than a lower surface of the interlayer insulation layer 120 (e.g., the lower surface 152L of the conductive plug 152 may be farther away from the first surface 110F1 of the substrate 110 than the lower surface of the interlayer insulation layer 120).

In some embodiments, the conductive plug 152 may include Cu, CuSn, CuMg, CuNi, CuZn, CuPd, CuAu, CuRe, CuW, W, or a W alloy, but is not limited thereto. For example, the conductive plug 152 may include at least one of Al, Au, Be, Bi, Co, Cu, Hf, In, Mn, Mo, Ni, Pb, Pd, Pt, Rh, Re, Ru, Ta, Te, Ti, W, Zn, and Zr and include a stack of one or more layers.

The first conductive barrier layer 154 may cover a sidewall and the lower surface 152L of the conductive plug 152. In some embodiments, the first conductive barrier layer 154 may include at least one of W, WN, WC, Ti, TiN, Ta, TaN, Ru, Co, Mn, WN, Ni, or NiB. The first conductive barrier layer 154 may have a thickness t11 of about 500 to 2000 Å.

The second conductive barrier layer 156 may cover a sidewall of the first conductive barrier layer 154. The second conductive barrier layer 156 may not cover a lower surface and a lower sidewall of the first conductive barrier layer 154. The lower surface and the lower sidewall of the first conductive barrier layer 154 may contact the landing pad metal layer 134W. In some embodiments, the second conductive barrier layer 156 may include at least one of W, WN, WC, Ti, TiN, Ta, TaN, Ru, Co, Mn, WN, Ni, or NiB. The second conductive barrier layer 156 may include the same material as the first conductive barrier layer 154, but is not limited thereto. The second conductive barrier layer 156 may have a thickness t12 of about 500 to 2000 Å.

The via insulation layer 158 may cover a sidewall of the second conductive barrier layer 156. The via insulation layer 158 may function as an insulation spacer to limit and/or prevent the conductive material (e.g., the conductive plug 152 and the first and second conductive barrier layers 154 and 156) included in the through-via structure 150 from directly contacting the substrate 110.

The via insulation layer 158 may include oxide, nitride, carbon, polymer, or a combination thereof. The via insulation layer 158 may be formed by a chemical vapor deposition (CVD) process, for example. The via insulation layer 158 may have a thickness of about 500 to 3000 Å. For example, the via insulation layer 158 may include silicon oxide. In some embodiments, the via insulation layer 158 may include a different material than the interlayer insulation layer 120.

A second pad 162 may be disposed on the second surface 110F2 of the substrate 110 to be connected to the through-via structure 150. The second pad 162 may include Al, Ni, Cu, or a combination thereof.

Referring to FIG. 3, the via insulation layer 158 or the second conductive barrier layer 156 may not contact (or may be spaced apart from) the landing pad metal layer 134W, but the first conductive barrier layer 154 may contact the landing pad metal layer 134W.

The lower surface of the first conductive barrier layer 154 may be positioned at a first vertical distance VD1 from the first surface 110F1 of the substrate 110 along a vertical direction (e.g., a Z direction). The lower surface of the second conductive barrier layer 156 may be positioned at a second vertical distance VD2 less than the first vertical distance VD1 from the first surface 110F1 of the substrate 110 along the vertical direction (e.g., the Z direction).

A stepped portion 150HS may be formed at a bottom of the through-via hole 150H. For example, the stepped portion 150HS may be defined by a portion of the inter layer insulation layer 120 by a lowermost surface of the via insulation layer 158 and a sidewall of the second conductive barrier layer 156 adjacent to the lowermost surface of the via insulation layer 158 or by a lowermost surface of the second conductive barrier layer 156 and a sidewall of the first conductive barrier layer 154 adjacent to the lowermost surface of the second conductive barrier layer 156. This may be a structure obtained by a plurality of etch processes of downwardly enlarging the through-via hole 150H to sequentially form the via insulation layer 158, the second conductive barrier layer 156, and the first conductive barrier layer 154.

In some embodiments, to form the through-via structure 150, after the landing pad 134 and the inter-metal insulation layer 130 are formed first on the first surface 110F1 of the substrate 110, a process of forming the through-via structure 150 may be performed (e.g., a via last method may be performed). For example, after the plurality of semiconductor devices 122, the wiring structure 124, and the interlayer insulation layer 120 are formed on the first surface 110F1 of the substrate 110, the landing pad 134, the multilayer wiring structure 132, and the inter-metal insulation layer 130 may be formed on the interlayer insulation layer 120, and then the through-via hole 150H penetrating the substrate 110 and a portion of the interlayer insulation layer 120 (e.g., extending from the second surface 110F2 of the substrate 110 into interlayer insulation layer 120) may be formed. The via insulation layer 158 may be formed on the inner surface of the through-via hole 150H, and then a portion of the via insulation layer 158 on the bottom of the through-via hole 150H and the interlayer insulation layer 120 may be etched to expose the upper surface 134BU of the landing pad barrier layer 134B, such that the bottom of the through-via hole 150H may be enlarged in a depth direction of the through-via hole 150H. Thereafter, the second conductive barrier layer 156 may be formed on the inner surface of the through-via hole 150H having the via insulation layer 158, and then a portion of the second conductive barrier layer 156 on the bottom of the through-via hole 150H and the landing pad barrier layer 134B may be etched to expose the upper surface 134WU of the landing pad metal layer 134W, such that the bottom of the through-via hole 150H may be further enlarged in the depth direction of the through-via hole 150H. Next, the first conductive barrier layer 154 may be formed on the inner surface of the through-via hole 150H having the via insulation layer 158 and the second conductive barrier layer 156.

In a through-via structure according to a comparative example, the second conductive barrier layer 156 may be omitted, and an outer sidewall of the first conductive barrier layer 154 may be covered by the via insulation layer 158 and the interlayer insulation layer 120. In this case, when the landing pad metal layer 134W is etched on the bottom of the through-via hole 150H, a metal etched from the landing pad metal layer 134W may be left unremoved in the through-via hole 150H, such that the metal may be easily redeposited on the inner sidewall of the through-via hole 150H (e.g., on the interlayer insulation layer 120 and/or the via insulation layer 158). Accordingly, the interlayer insulation layer 120 and/or the via insulation layer 158 may be contaminated by the metal, such that insulating characteristics of the interlayer insulation layer 120 and/or the via insulation layer 158 may not sufficiently be secured.

However, in the through-via structure 150 according to example embodiments, the second conductive barrier layer 156 may be formed in the inner surface of the through-via hole 150H to conformally cover the via insulation layer 158 and the interlayer insulation layer 120, and then the etch process for exposing the upper surface 134WU of the landing pad metal layer 134W may be performed at the bottom of the through-via hole 150H. When the landing pad metal layer 134W is etched at the bottom of the through-via hole 150H, the second conductive barrier layer 156 may function as a protection layer to cover the surfaces of the via insulation layer 158 and the interlayer insulation layer 120. Thus, the metal etched from the landing pad metal layer 134W may not be redeposited on the interlayer insulation layer 120 and/or the via insulation layer 158, such that the interlayer insulation layer 120 and/or the via insulation layer 158 may be limited and/or prevented from being contaminated by the metal. Accordingly, the reliability of the integrated circuit device 100 may be enhanced.

Figure 4:
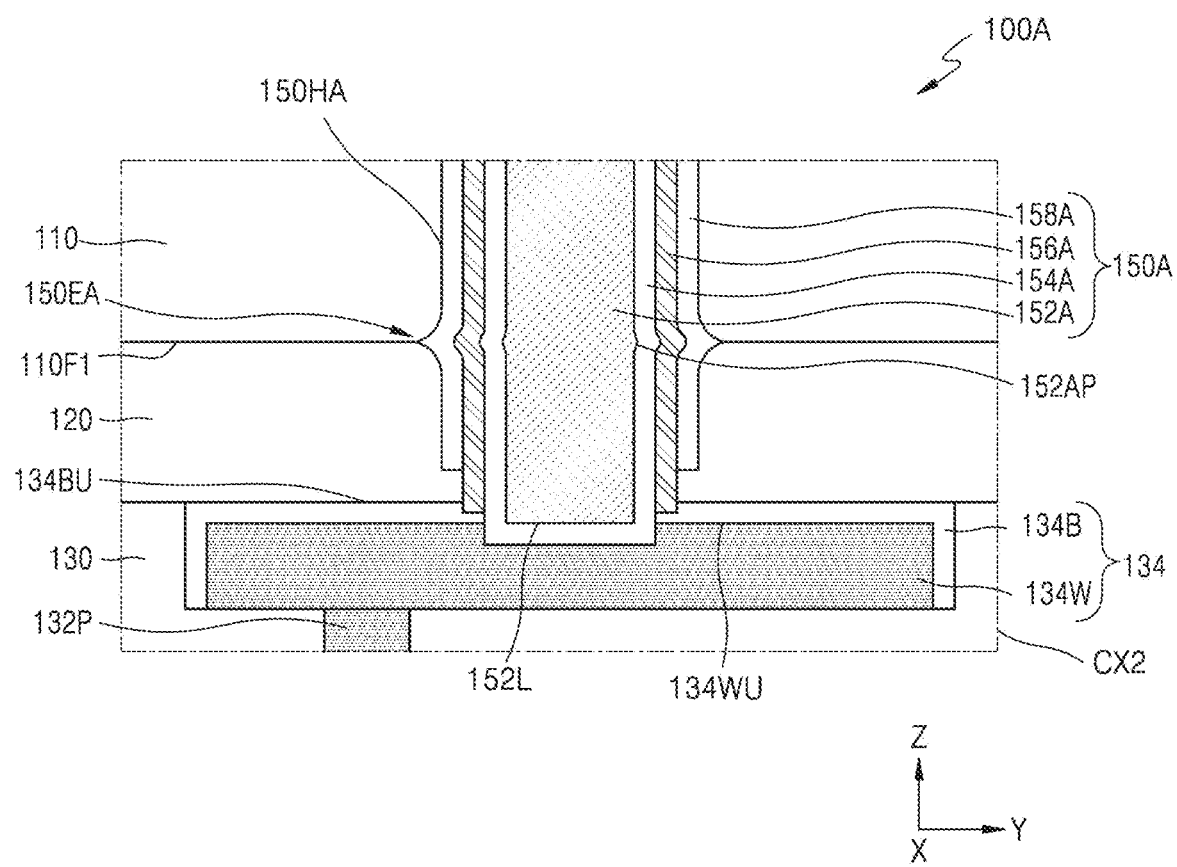
FIG. 4 is a cross-sectional view illustrating an integrated circuit device according to example embodiments.

FIG. 4 is a cross-sectional view illustrating an integrated circuit device 100A according to example embodiments and is an enlarged view corresponding to portion CX2 of FIG. 2.

Referring to FIG. 4, a through-via hole 150HA may have an enlarged portion 150EA at a boundary region between the substrate 110 and the interlayer insulation layer 120. The enlarged portion 150EA may be defined as a space between a rounded sidewall of the substrate 110 and a rounded sidewall of the interlayer insulation layer 120. A width of the enlarged portion 150EA of the through-via hole 150HA may be greater than a width of a bottom surface of the through-via hole 150HA.

A through-via structure 150A may be disposed in the through-via hole 150HA. Specifically, a via insulation layer 158A may be conformally disposed corresponding to a sidewall profile of the enlarged portion 150EA on an inner surface of the through-via hole 150HA, and a second conductive barrier layer 156A and a first conductive barrier layer 154A may be sequentially conformally disposed corresponding to the sidewall profile of the enlarged portion 150EA on the inner surface of the through-via hole 150HA having the via insulation layer 158A. A conductive plug 152A may include a protrusion portion 152AP corresponding to the sidewall profile of the enlarged portion 150EA.

In some embodiments, in the process of forming the through-via hole 150HA, a portion of the substrate 110 and a portion of the interlayer insulation layer 120 that are exposed on the inner surface of the through-via hole 150HA at the boundary region between the substrate 110 and the interlayer insulation layer 120 may be etched at a relatively high etch rate, thus forming the enlarged portion 150EA.

Ins some embodiments, the sidewall of the substrate 110 and the sidewall of the interlayer insulation layer 120 in the enlarged portion 150EA are not limited to the rounded surface. For example, the sidewall of the substrate 110 and the sidewall of the interlayer insulation layer 120 in the enlarged portion 150EA may have a sloped surface that is sloped at a desired (and/or alternatively predetermined) angle.

Figure 5:
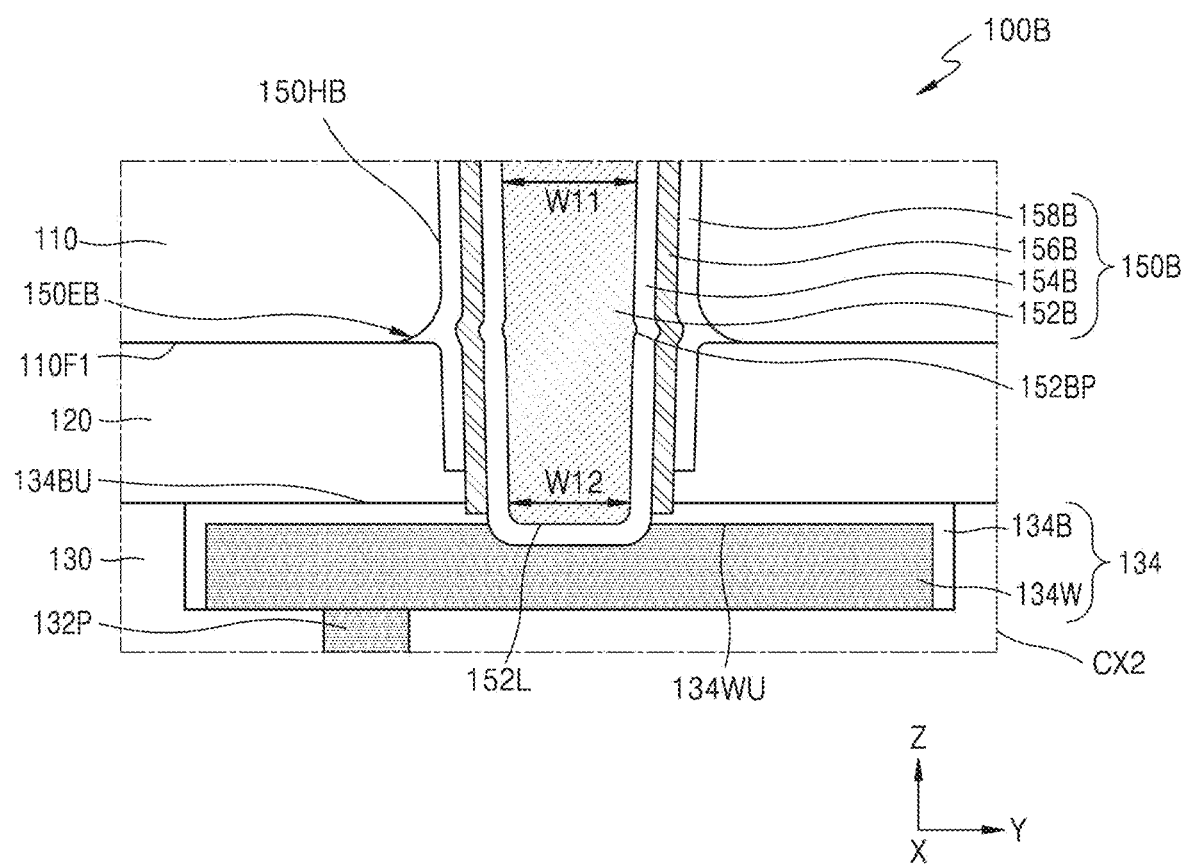
FIG. 5 is a cross-sectional view illustrating an integrated circuit device according to example embodiments.

FIG. 5 is across-sectional view illustrating an integrated circuit device 100B according to example embodiments and is an enlarged view corresponding to portion CX2 of FIG. 2.

Referring to FIG. 5, a through-via hole 150HB may have an enlarged portion 150EB at a boundary region between the substrate 110 and the interlayer insulation layer 120. The enlarged portion 150EB may be defined as a space between a rounded sidewall of the substrate 110 and an upper surface of the interlayer insulation layer 120 extending in the horizontal direction (e.g., the X direction or the Y direction). A width of the enlarged portion 150EB of the through-via hole 150HB may be greater than a width of a bottom surface of the through-via hole 150HB.

A through-via structure 150B may be disposed in the through-via hole 150HB. Specifically, a via insulation layer 158B may be conformally disposed corresponding to a sidewall profile of the enlarged portion 150EB on an inner surface of the through-via hole 150HB, and a second conductive barrier layer 156B and a first conductive barrier layer 154B may be sequentially conformally disposed corresponding to the sidewall profile of the enlarged portion 150EB on the inner surface of the through-via hole 150HB having the via insulation layer 158B. A conductive plug 152B may include a protrusion portion 152BP corresponding to the sidewall profile of the enlarged portion 150EB.

In some embodiments, the through-via hole 150HB may have a sidewall having a desired (and/or alternatively predetermined) slope and a bottom having a rounded profile. For example, the conductive plug 152B may have an upper width W11 (a width of a portion thereof positioned at the same level as a portion of the substrate 110 remote from the first surface 110F1 of the substrate 110) greater than a lower width W12 (e.g., a width of another portion thereof positioned at the same level as a lower surface of the interlayer insulation layer 120).

In some embodiments, in the process of forming the through-via hole 150HB, an etch rate of the substrate 110 may be different from an etch rate of the interlayer insulation layer 120. Thus, when the interlayer insulation layer 120 may be etched at the bottom of the through-via hole 150HB, the first surface 110F1 of the substrate 110 contacting the interlayer insulation layer 120 may be etched at a relatively high etch rate, thus forming the enlarged portion 150EB having an asymmetric shape.

Figure 6:
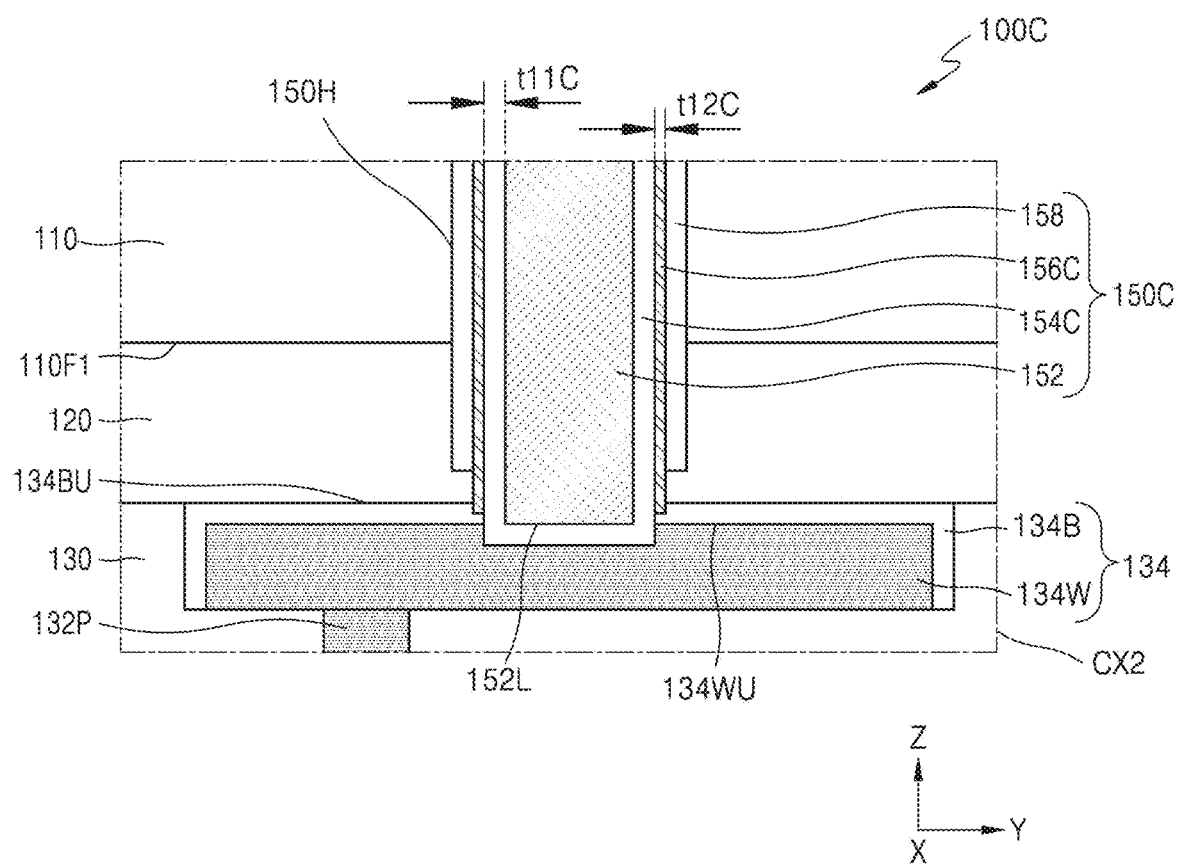
FIG. 6 is a cross-sectional view illustrating an integrated circuit device according to example embodiments.

FIG. 6 is across-sectional view illustrating an integrated circuit device 100C according to example embodiments and is an enlarged view corresponding to portion CX2 of FIG. 2.

Referring to FIG. 6, a through-via structure 150C may include the conductive plug 152, a first conductive barrier layer 154C, a second conductive barrier layer 156C, and the via insulation layer 158. A thickness t12C of the second conductive barrier layer 156C may be less than a thickness t11C of the first conductive barrier layer 154C. For example, the first conductive barrier layer 154C may have the thickness t11C of about 500 to 2000 Å, and the second conductive barrier layer 156C may have the thickness t12C of about 500 to 1000 Å.

As an example, the second conductive barrier layer 156C may be formed on an inner surface of the through-via hole 150H to conformally cover the via insulation layer 158 and the interlayer insulation layer 120, and then an etch process of a bottom of the through-via hole 150H may be performed to expose the upper surface 134WU of the landing pad metal layer 134W. When the landing pad metal layer 134W is etched at the bottom of the through-via hole 150H, a metal etched from the landing pad metal layer 134W may not be redeposited on the interlayer insulation layer 120 and/or the via insulation layer 158. Thus, the interlayer insulation layer 120 and/or the via insulation layer 158 may be limited and/or prevented from being contaminated by the metal. In addition, since the thickness t12C of the second conductive barrier layer 156C is relatively small, a volume of the conductive plug 152 filling the through-via hole 150H may be relatively increased, and thus a resistance of the conductive plug 152 may be reduced. Accordingly, the reliability of the integrated circuit device 100C may be enhanced.

Figure 7:
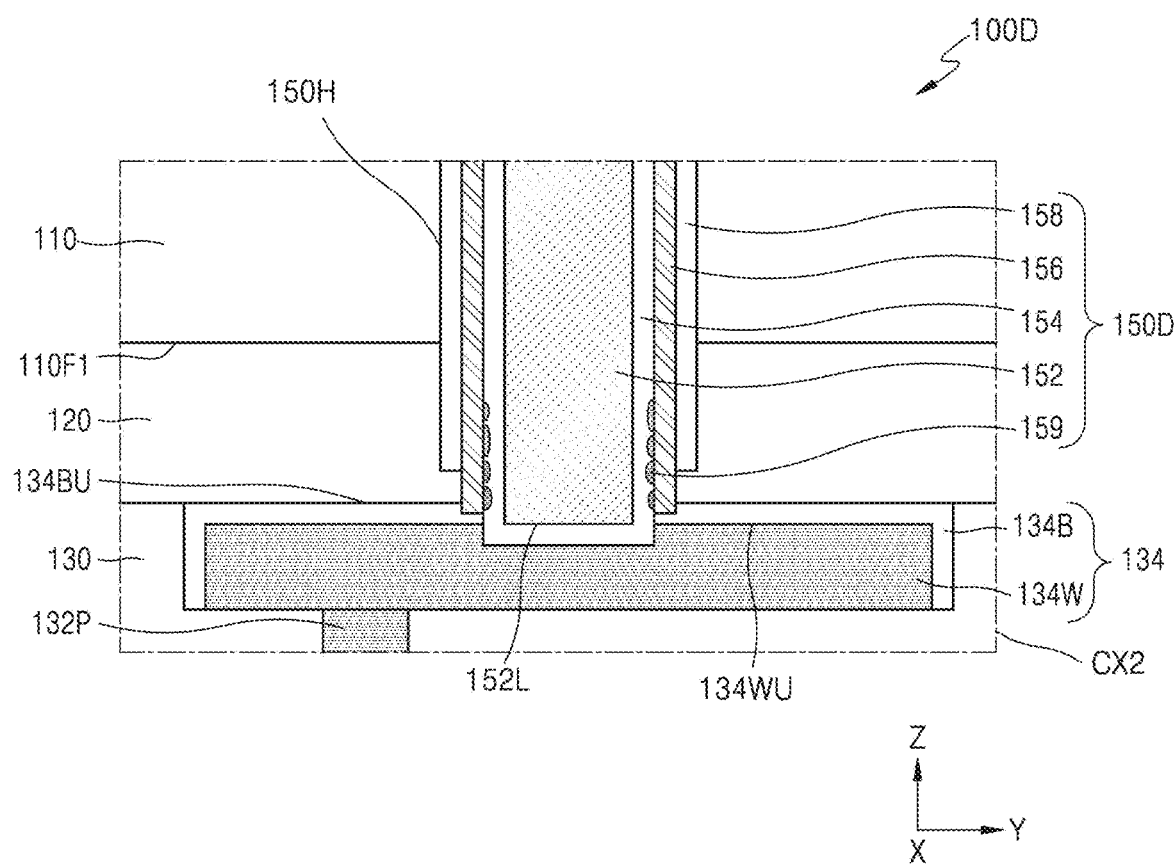
FIG. 7 is a cross-sectional view illustrating an integrated circuit device according to example embodiments.

FIG. 7 is a cross-sectional view illustrating an integrated circuit device 100D according to example embodiments and is an enlarged view corresponding to portion CX2 of FIG. 2.

Referring to FIG. 7, a through-via structure 150D may further include metal islands 159 between the first conductive barrier layer 154 and the second conductive barrier layer 156. The metal islands 159 may include particles formed of a metal or may be a material layer formed by agglomeration of the particles formed of the metal. In some embodiments, the metal islands 159 may be disposed spaced apart from each other to form discontinuous layers. In some embodiments, the metal islands 159 may be a continuous material layer continuously extending in the vertical direction (e.g., the Z direction), between the first conductive barrier layer 154 and the second conductive barrier layer 156.

In some embodiments, the metal islands 159 may include the same metal as the landing pad metal layer 134W. For example, the metal islands 159 may include Ni, Cu, Al, Au, W, or a combination thereof, but are not limited thereto.

As an example, the second conductive barrier layer 156 may be formed on an inner surface of the through-via hole 150H to conformally cover the via insulation layer 158 and the interlayer insulation layer 120, and then an etch process of a bottom of the through-via hole 150H may be performed to expose the upper surface 134WU of the landing pad metal layer 134W. When the landing pad metal layer 134W is etched at the bottom of the through-via hole 150H, the second conductive barrier layer 156 may function as a protection layer to cover surfaces of the interlayer insulation layer 120 and the via insulation layer 158, and the metal etched from the landing pad metal layer 134W may be redeposited on or adhered to the second conductive barrier layer 156 to form the metal islands 159. Thereafter, the first conductive barrier layer 154 may be formed on the second conductive barrier layer 156 to cover the metal islands 159.

According to example embodiments, in the process of etching the landing pad metal layer 134W at the bottom of the through-via hole 150H, even if the metal etched from the landing pad metal layer 134W is redeposited on the inner surface of the through-via hole 150H, the second conductive barrier layer 156 may function as a protection layer to cover the surfaces of the interlayer insulation layer 120 and the via insulation layer 158. The metal islands 159 may be redeposited on the second conductive barrier layer 156 instead of on the interlayer insulation layer 120 and the via insulation layer 158. Thus, metal contamination of the interlayer insulation layer 120 and/or the via insulation layer 158 may be limited and/or prevented, such that the reliability of the integrated circuit device 100D may be enhanced.

FIGS. 8, 9, 10, 11A, 12A, 12B, 13A, 13B, 14A, 14B, 15, and 16 are cross-sectional views illustrating operations in a method of manufacturing an integrated circuit device 100D according to example embodiments. FIGS. 8, 9, 10, 11A, 12A, 13A, 14A, 15 and 16 are cross-sectional views illustrating a portion of the main cell region MCR and the portion of the through-via region TVR of FIG. 1. FIGS. 11B, 12B, 13B, and 14B are enlarged views of portion CX2 of FIGS. 11A, 12A, 13A, and 14A, respectively.

Figure 8:
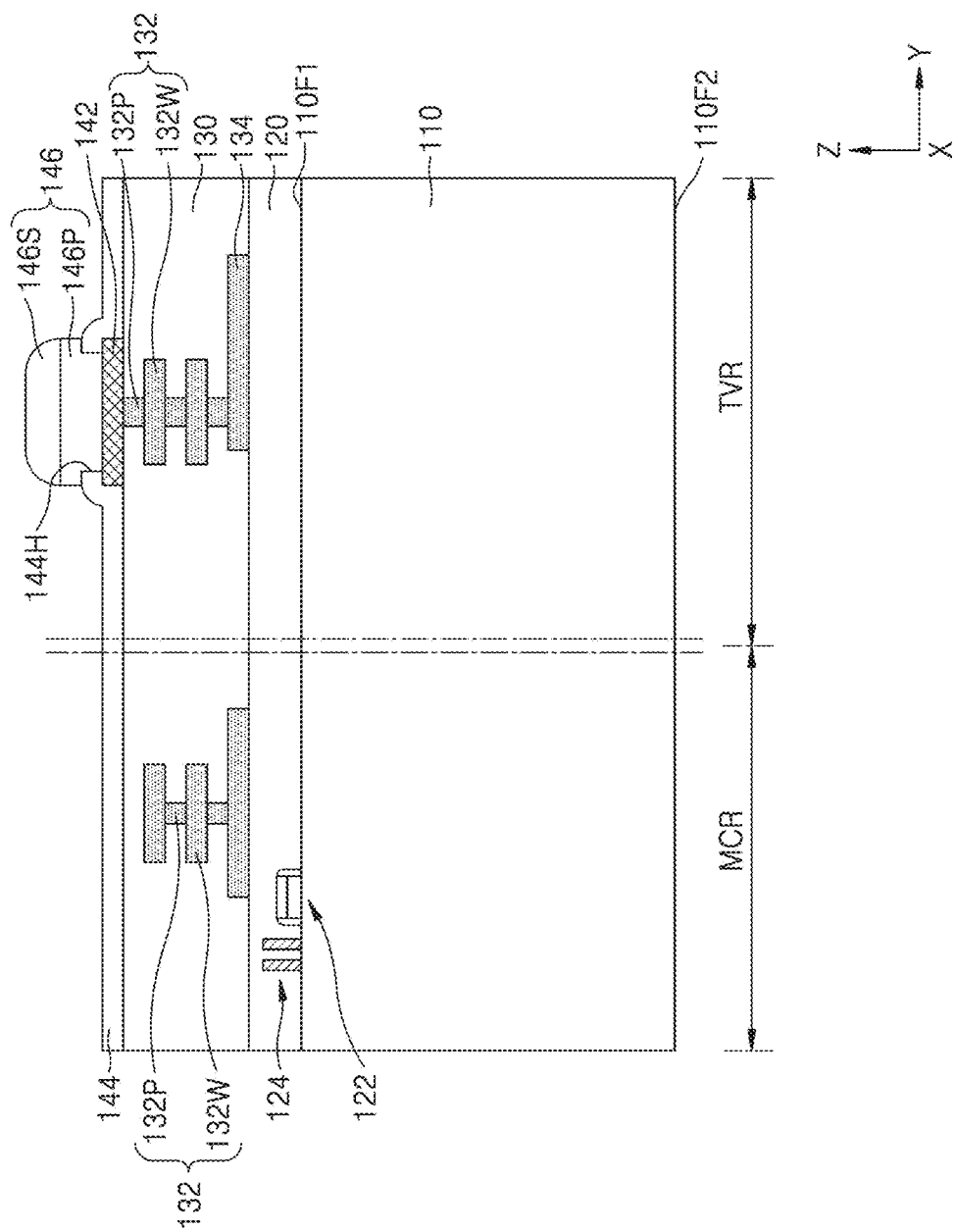

Referring to FIG. 8, the plurality of semiconductor devices 122 and the wiring structure 124 may be formed on the first surface 110F1 of the substrate 110. The interlayer insulation layer 120 may be formed on the substrate 110 to cover the plurality of semiconductor devices 122 and the wiring structure 124.

The landing pad 134 and the multilayer wiring structure 132 may be formed on the interlayer insulation layer 120, and then the inter-metal insulation layer 130 may be formed on the interlayer insulation layer 120 to cover the landing pad 134 and the multilayer wiring structure 132

In some embodiments, the process of forming the landing pad 134 and the multilayer wiring structure 132 may include a single damascene process or a dual damascene process. For example, the inter-metal insulation layer 130 may be formed on the interlayer insulation layer 120, and then the inter-metal insulation layer 130 may be patterned to form a wiring hole in the main cell region MCR and a landing pad hole in the through-via region TVR. Thereafter, the landing pad 134 may be formed in the landing pad hole and the wiring line 132W in the wiring hole. For example, the formation of the landing pad 134 may include sequentially forming a first layer for forming the landing pad barrier layer 134B and a second layer for forming the landing pad metal layer 134W, and planarizing the first layer and the second layer until the inter-metal insulation layer 130 is exposed, to leave the landing pad barrier layer 134B and the landing pad metal layer 134W in the landing pad hole.

In some embodiments, the landing pad barrier layer 134B may be formed of W, WN, WC, Ti, TiN, Ta, TaN, Ru, Co, Mn, WN, Ni, or NiB and may be formed by a CVD process or a physical vapor deposition (PVD) process. The landing pad metal layer 134W may be formed of Ni, Cu, Al, W, or a combination thereof and may be formed by an electroplating process. For example, the formation of the landing pad metal layer 134W may include forming a seed layer including copper (Cu) on the landing pad barrier layer 134B and forming a Cu layer from the seed layer by the electroplating process.

Thereafter, processes similar to the process of forming the landing pad 134 may be repeatedly performed on the landing pad 134 and the wiring line 132W to form the multilayer wiring structure 132 including the wiring via 132P and the wiring line 132W.

A conductive layer may be formed on the inter-metal insulation layer 130, and then the conductive layer may be patterned to form the first pad 142. The first pad 142 may be formed of Al, Ni, Cu, or a combination thereof.

The passivation layer 144 exposing a portion of the first pad 142 may be formed on the inter-metal insulation layer 130. The passivation layer 144 may be formed of polyimide and/or silicon nitride.

The bump structure 146 may be formed on the first pad 142 exposed through passivation layer 144 to be electrically connected to the first pad 142. The bump structure 146 may include the pillar 146P and the solder layer 146S. The pillar 146P may be formed of Cu, Ni, or an alloy thereof and may formed by an electroplating process. The solder layer 146S may be formed of Sn, Ag, Pb, Au, Cu, B, or a combination thereof and may be formed by sequentially performing an electroplating process and a reflowing process.

Figure 9:
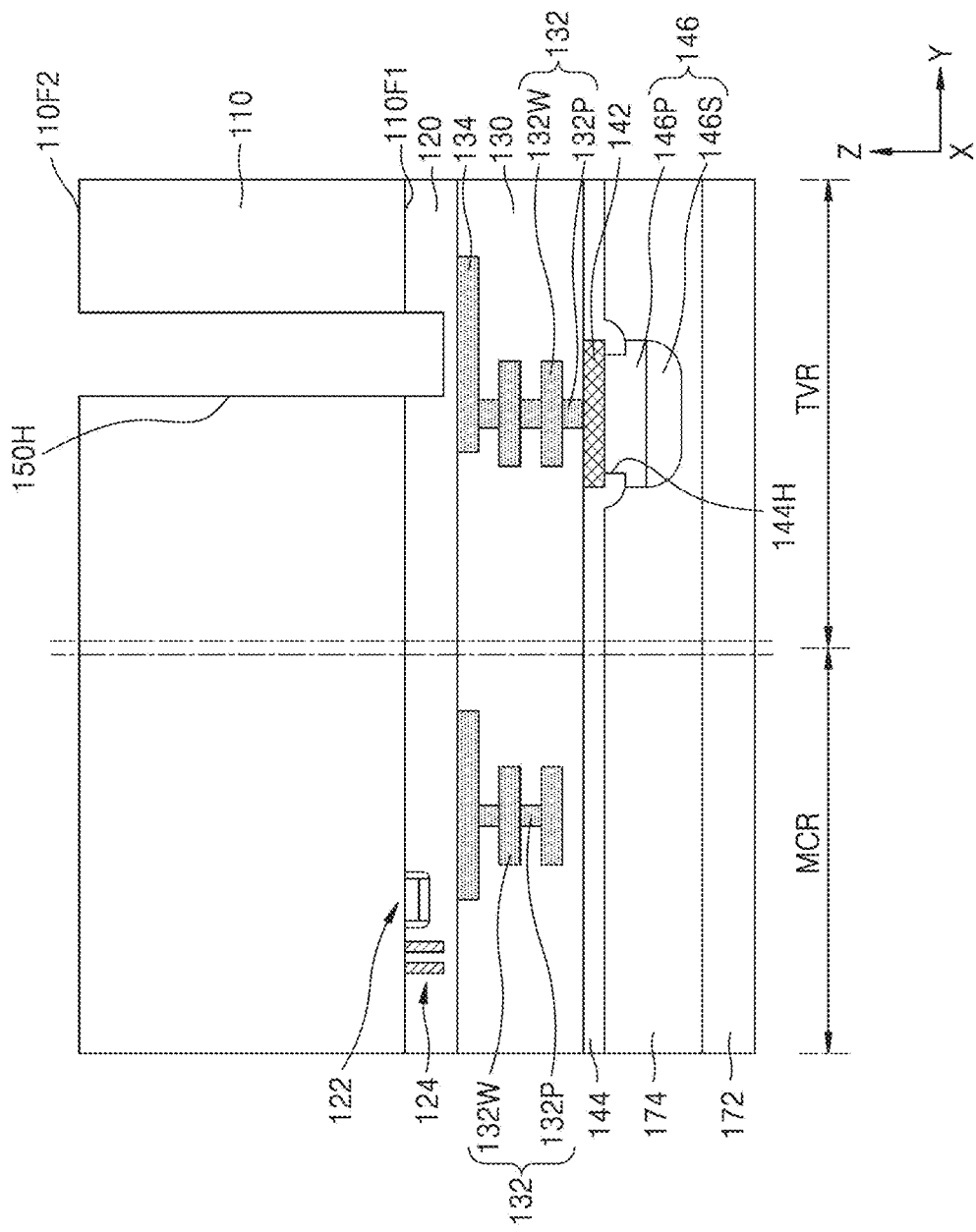

Referring to FIG. 9, a support substrate 172 may be bonded to the bump structure 146 and the passivation layer 144. The support substrate 172 may be bonded to the bump structure 146 and the passivation layer 144 through an adhesive layer 174. A grinding process may be performed on the second surface 110F2 of the substrate 110, thus removing a portion of the substrate 110 by a desired (and/or alternatively predetermined) thickness from the second surface 110F2 of the substrate 110.

A mask pattern may be formed on the second surface 110F2 of the substrate 110, and then the substrate 110 may be etched using the mask pattern as an etch mask to from the through-via hole 150H. The through-via hole 150H may penetrate the substrate 110 and may extend into the interlayer insulation layer 120.

In some embodiments, the through-via hole 150H may be formed by an anisotropic etch process or a laser drilling process. As the through-via hole 150H does not completely penetrate the interlayer insulation layer 120, an upper surface of the landing pad 134 may not be exposed by the through-via hole 150H and may be covered by the interlayer insulation layer 120.

The through-via hole 150H may be formed with various widths, depths, or shapes. For example, as shown in FIG. 9, the through-via hole 150H may be formed to have a sidewall perpendicular to the first surface 110F1 of the substrate 110. In some embodiments, in the process of forming the through-via hole 150HB shown in FIG. 5, the sidewall of the through-via hole 150HB may be formed to have a desired (and/or alternatively predetermined) slope, such that an upper width of the through-via hole 150HB may be greater than a lower width of the through-via hole 150HB. In this case, the integrated circuit device 100B described with reference to FIG. 5 may be formed.

In addition, in the process of forming the through-via hole 150HB show in FIG. 5, when an etching condition of the substrate 110 and an etching condition of the interlayer insulation layer 120 are differently controlled, a portion of the substrate 110 may be etched at a relatively high etch rate at a boundary region between the substrate 110 and the interlayer insulation layer 120 to form the enlarged portion 150EB. In this case, the integrated circuit device 100B described with reference to FIG. 5 may be formed.

In some embodiments, in the process of forming the through-via hole 150HA shown in FIG. 4, at a boundary region between the substrate 110 and the interlayer insulation layer 120, a portion of the substrate 110 and a portion of the interlayer insulation layer 120 that are exposed on an inner surface of the through-via hole 150HA may be etched at a relatively high etch rate to form the enlarged portion 150EA. In this case, the integrated circuit device 100A described with reference to FIG. 4 may be formed.

After the through-via hole 150H is formed, the mask pattern may be removed.

Referring to FIG. 10, the via insulation layer 158 may be formed on the second surface 110F2 of the substrate 110 to cover an inner surface of the through-via hole 150H. The via insulation layer 158 may be formed of oxide, nitride, carbide, polymer, or a combination thereof. The via insulation layer 158 may be formed by a CVD process, for example. The via insulation layer 158 may have a thickness of about 500 to 3000 Å. For example, the via insulation layer 158 may be formed of a silicon oxide layer formed by a sub-atmospheric CVD process.

Figure 11A:
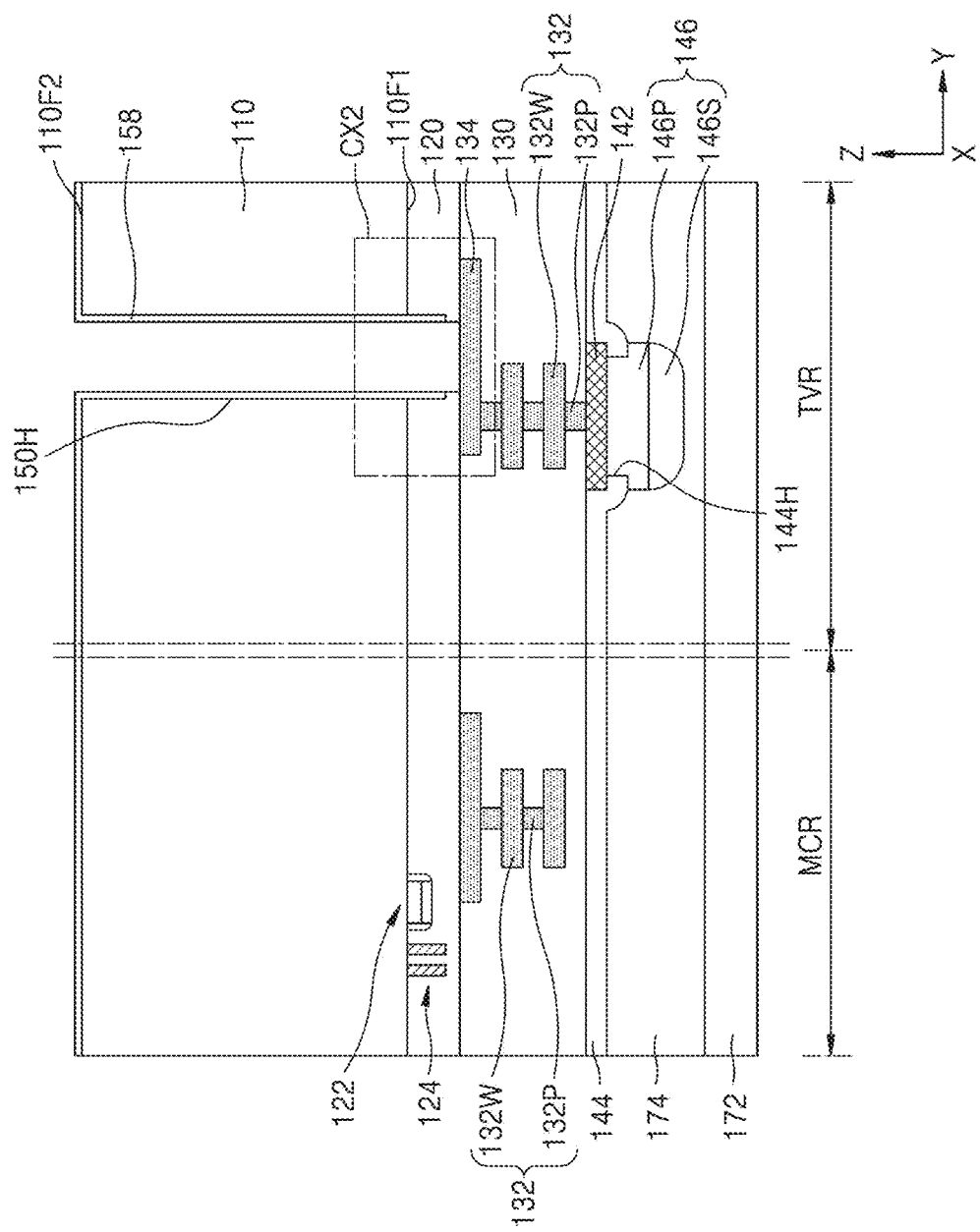
Figure 11B:
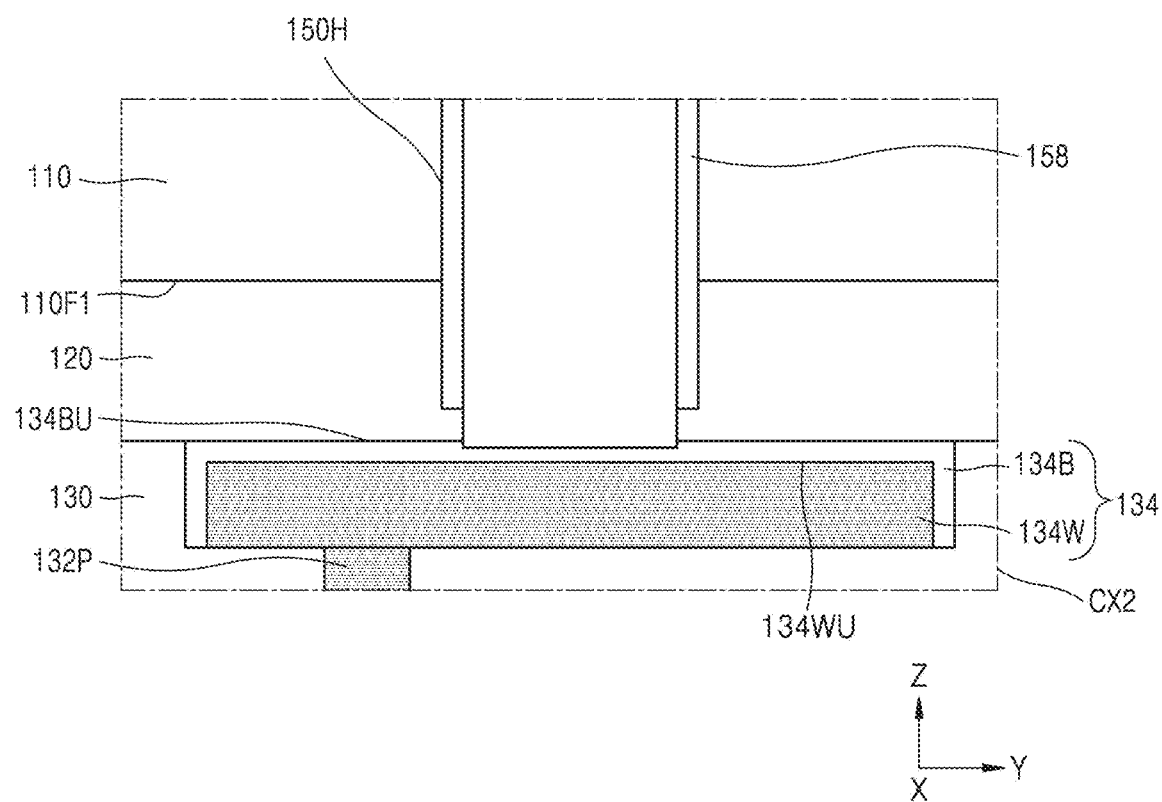

Referring to FIGS. 11A and 11B, the via insulation layer 158 and the interlayer insulation layer 120 at a bottom of the through-via hole 150H may be etched to enlarge downward the through-via hole 150H. At this time, the landing pad barrier layer 134B may function as an etch stop layer, and thus the upper surface 134WU of the landing pad metal layer 134W covered by the landing pad barrier layer 134B may not be exposed by the through-via hole 150H.

Figure 12A:
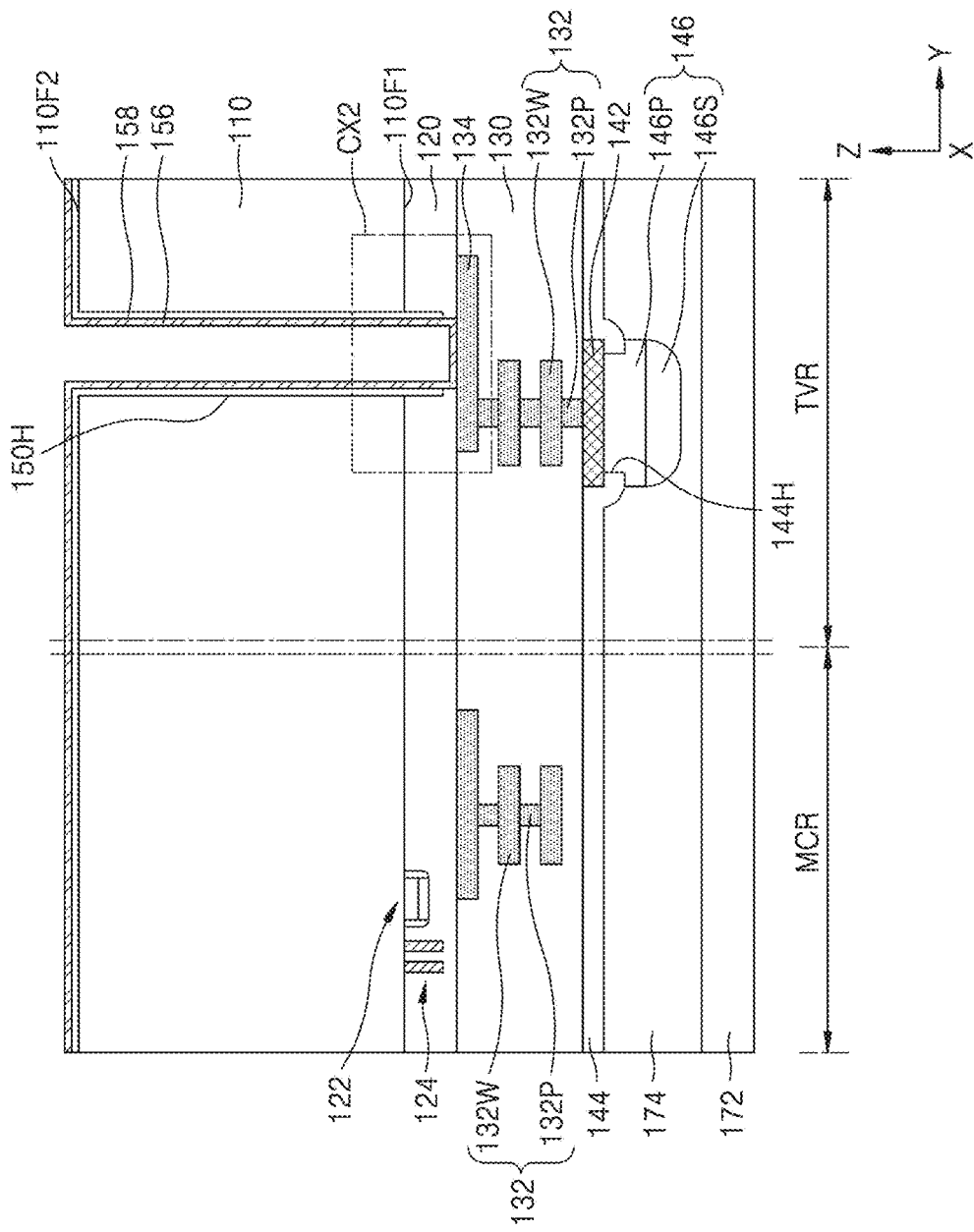
Figure 12B:
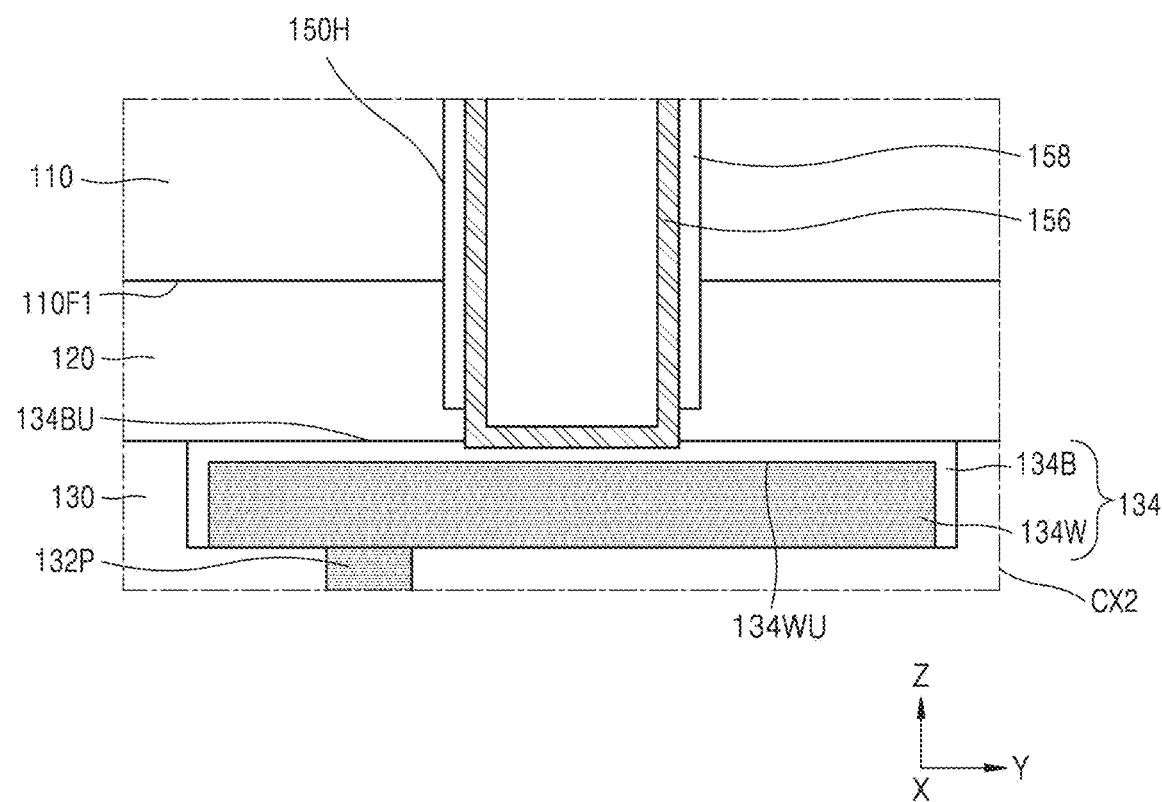

Referring to FIGS. 12A and 12B, the second conductive barrier layer 156 may be formed on the inner surface of the through-via hole 150H having the via insulation layer 158. The second conductive barrier layer 156 may be formed of WN, WC, Ti, TiN, Ta, TaN, Ru, Co, Mn, WN, Ni, or NiB and may be formed by a PVD process, an electroplating process, or an electroless plating process. The second conductive barrier layer 156 may have a thickness (see. e.g., t12 of FIG. 3) of about 500 to 2000 Å.

The second conductive barrier layer 156 may be conformally formed to cover entire surfaces of the via insulation layer 158 and the interlayer insulation layer 120 that are exposed on the inner surface of the through-via hole 150H. The second conductive barrier layer 156 may be conformally formed on the interlayer insulation layer 120 and the landing pad barrier layer 134B at the bottom of the through-via hole 150H.

Figure 13A:
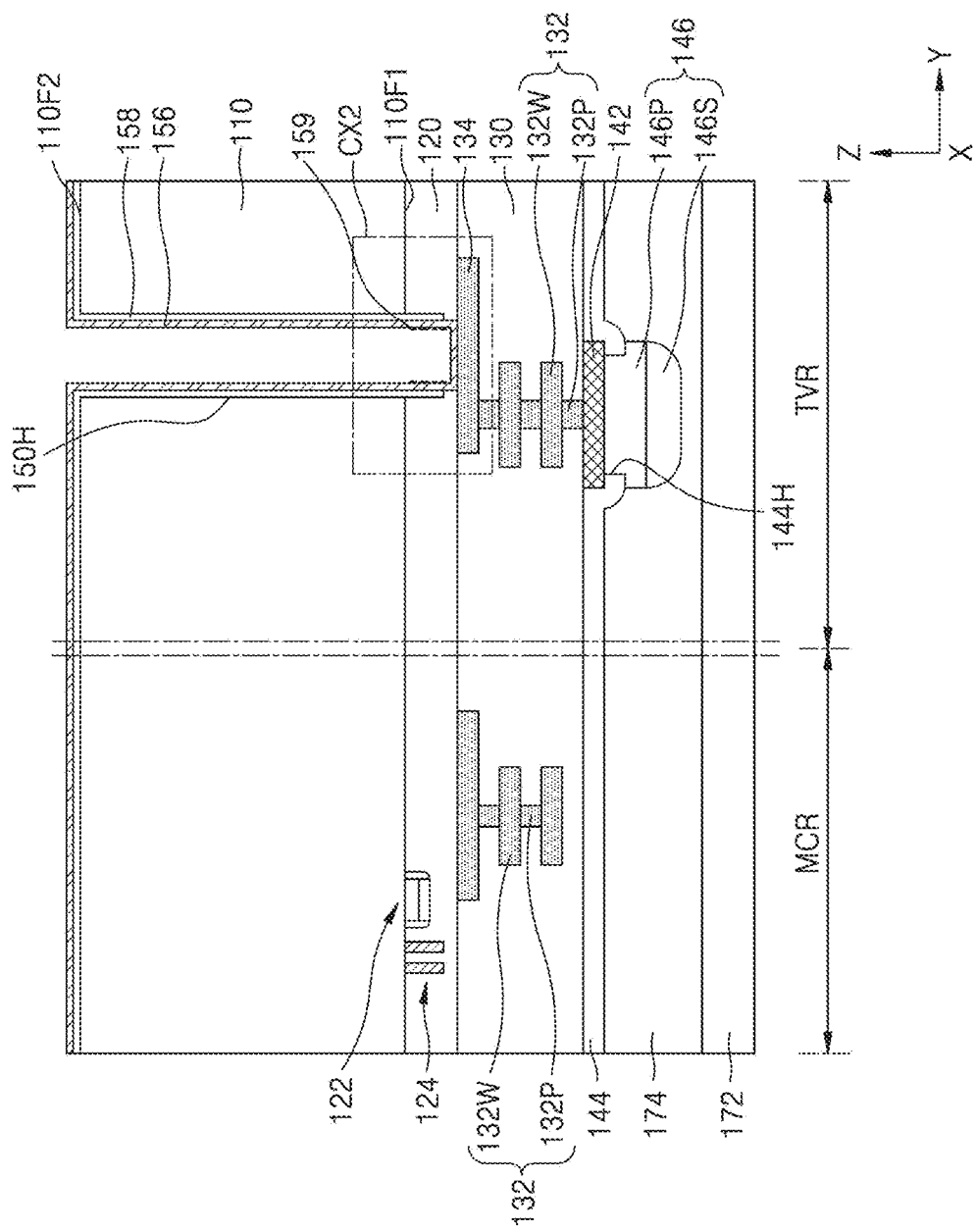
Figure 13B:
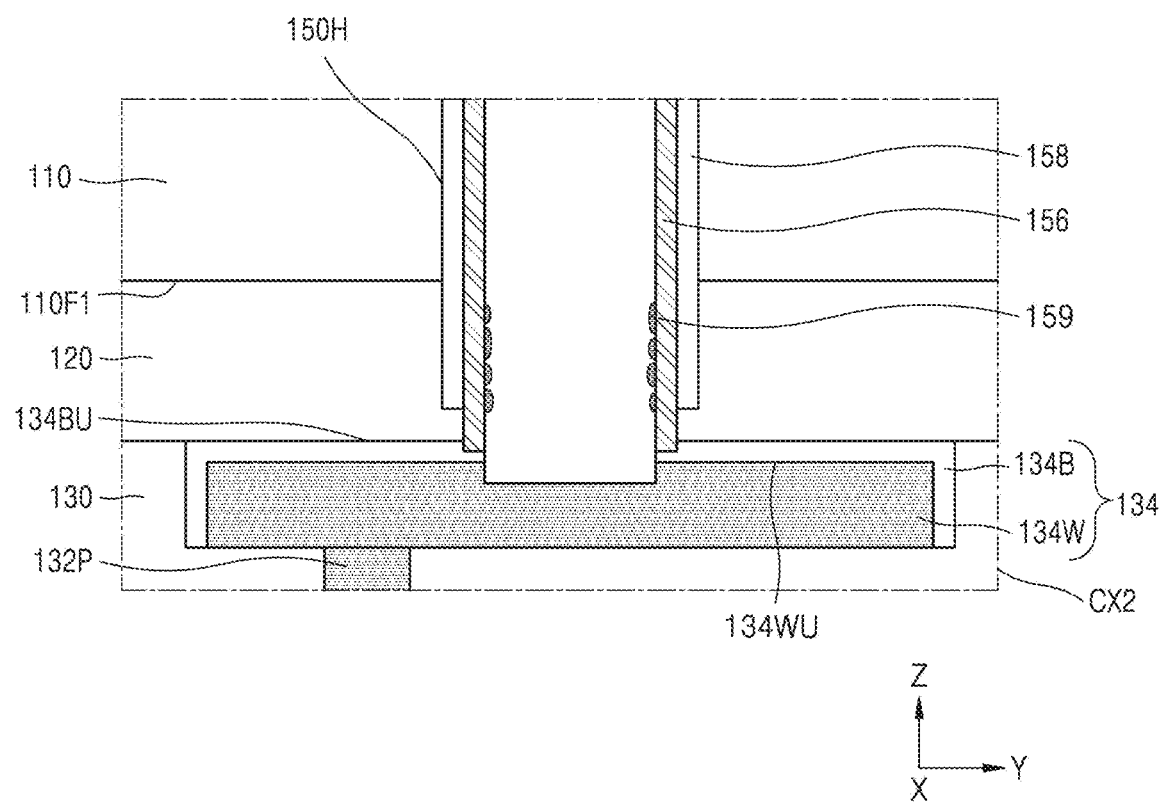

Referring to FIGS. 13A and 13B, the second conductive barrier layer 156 and the landing pad barrier layer 134B at the bottom of the through-via hole 150H may be etched to expose the upper surface 134WU of the landing pad metal layer 134W, thus further enlarging downward the through-via hole 150H. At that time, the landing pad metal layer 134W may be over-etched, such that a portion of an upper portion of the landing pad metal layer 134W may be recessed. Thus, the upper surface 134WU of a portion of the landing pad metal layer 134W exposed at the bottom of the through-via hole 150H may be positioned at a lower level than the upper surface 134WU of another portion of the landing pad metal layer 134W not exposed by the through-via hole 150H.

In the etch process for enlarging the through-via hole 150H, etched particles of the landing pad metal layer 134W may not be completely removed and may be re-deposited on the inner surface of the through-via hole 150H. By the redeposition of the etched particles, the metal islands 159 may be formed on a sidewall of the second conductive barrier layer 156. For example, when the landing pad metal layer 134W includes Cu, the metal islands 159 may include particles including Cu or may be a material layer formed by agglomeration of the particles including Cu. In some embodiments, the metal islands 159 may be disposed spaced apart from each other to form discontinuous layers. In some embodiments, the metal islands 159 may be a continuous material layer continuously extending in the vertical direction (e.g., the Z direction).

In a method of forming a through-via structure according to comparative example, the second conductive barrier layer 156 may be omitted, and the landing pad metal layer 134W may be etched in a state in which the via insulation layer 158 and the interlayer insulation layer 120 are exposed on the inner surface of the through-via hole 150H. In this case, metal particles etched in the etch process may be redeposited on a sidewall of the through-via hole 150H (e.g., on the interlayer insulation layer 120 and/or the via insulation layer 158). Accordingly, the interlayer insulation layer 120 and/or the via insulation layer 158 may be contaminated by the metal, such that insulating characteristics of the interlayer insulation layer 120 and/or the via insulation layer 158 may not be sufficiently secured.

However, according to example embodiments, in the etch process of the landing pad metal layer 134W, the second conductive barrier layer 156 may cover the surfaces of the via insulation layer 158 and the interlayer insulation layer 120, and thus the via insulation layer 158 and the interlayer insulation layer 120 may not be exposed on the inner surface of the through-via hole 150H. Thus, the metal particles removed in the etch process may not be redeposited on the interlayer insulation layer 120 and/or the via insulation layer 158, such that the interlayer insulation layer 120 and/or the via insulation layer 158 may be limited and/or prevented from being contaminated by the metal.

Figure 14A:
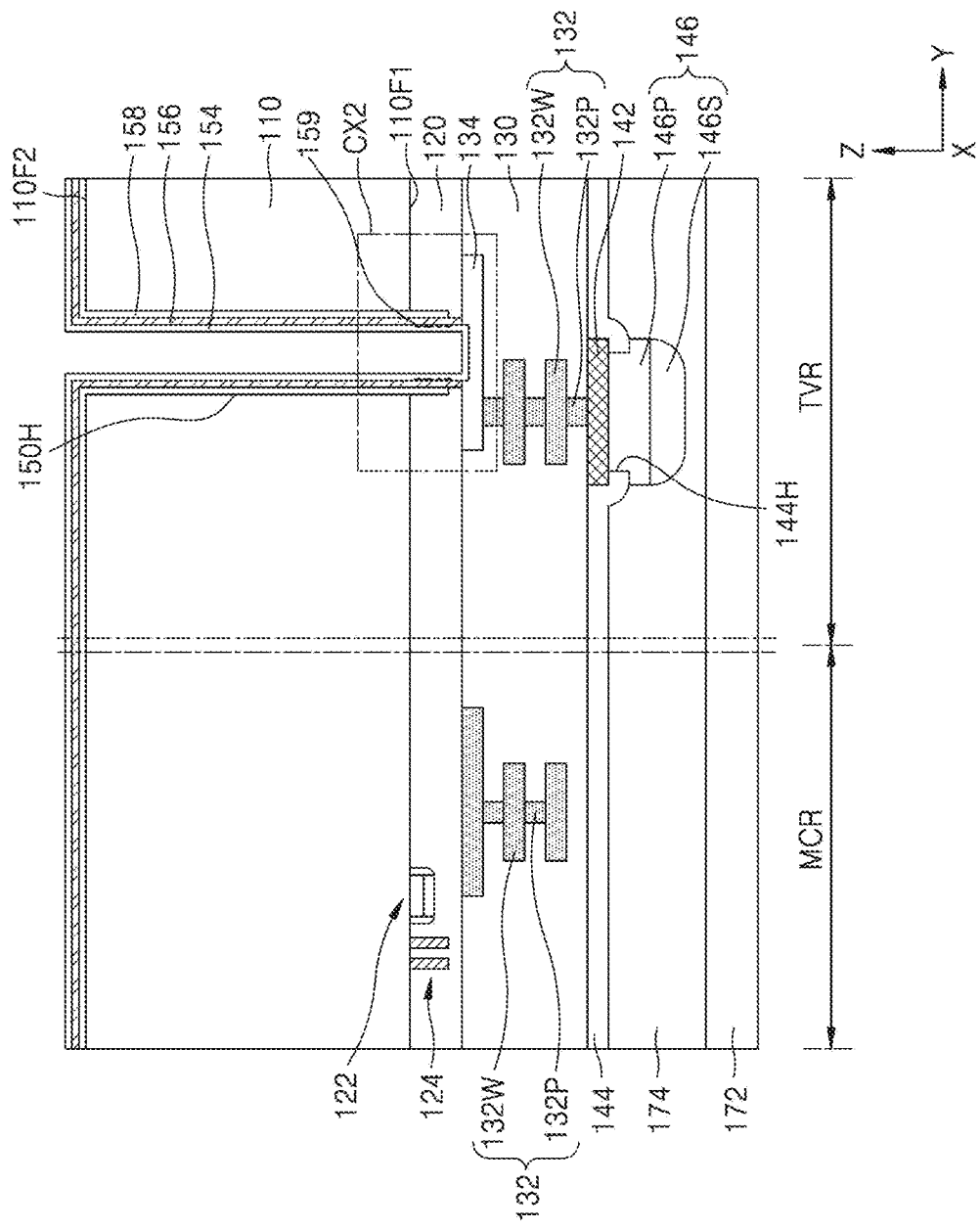
Figure 14B:
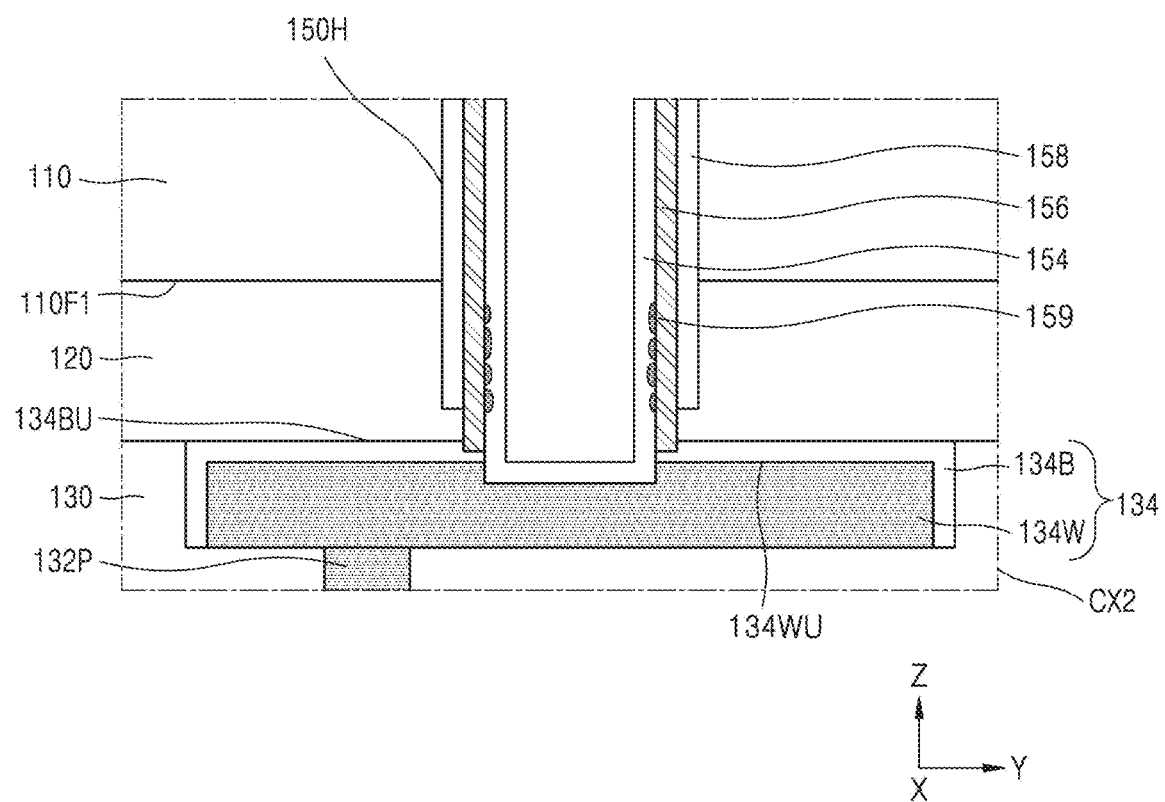

Referring to FIGS. 14A and 14B, the first conductive barrier layer 154 may be formed on the inner surface of the through-via hole 150H having the via insulation layer 158 and the second conductive barrier layer 156. The first conductive barrier layer 154 may be formed of W, WN, WC, Ti, TiN, Ta, TaN, Ru, Co, Mn, WN, Ni, or NiB and may be formed by a PVD process, an electroplating process, or an electroless plating process. The first conductive barrier layer 154 may have a thickness (see. e.g., t11 of FIG. 3) of about 500 to 2000 Å.

The first conductive barrier layer 154 may be formed to cover the second conductive barrier layer 156 and the metal islands 159. Thus, the metal islands 159 may be disposed between the first conductive barrier layer 154 and the second conductive barrier layer 156.

Figure 15:
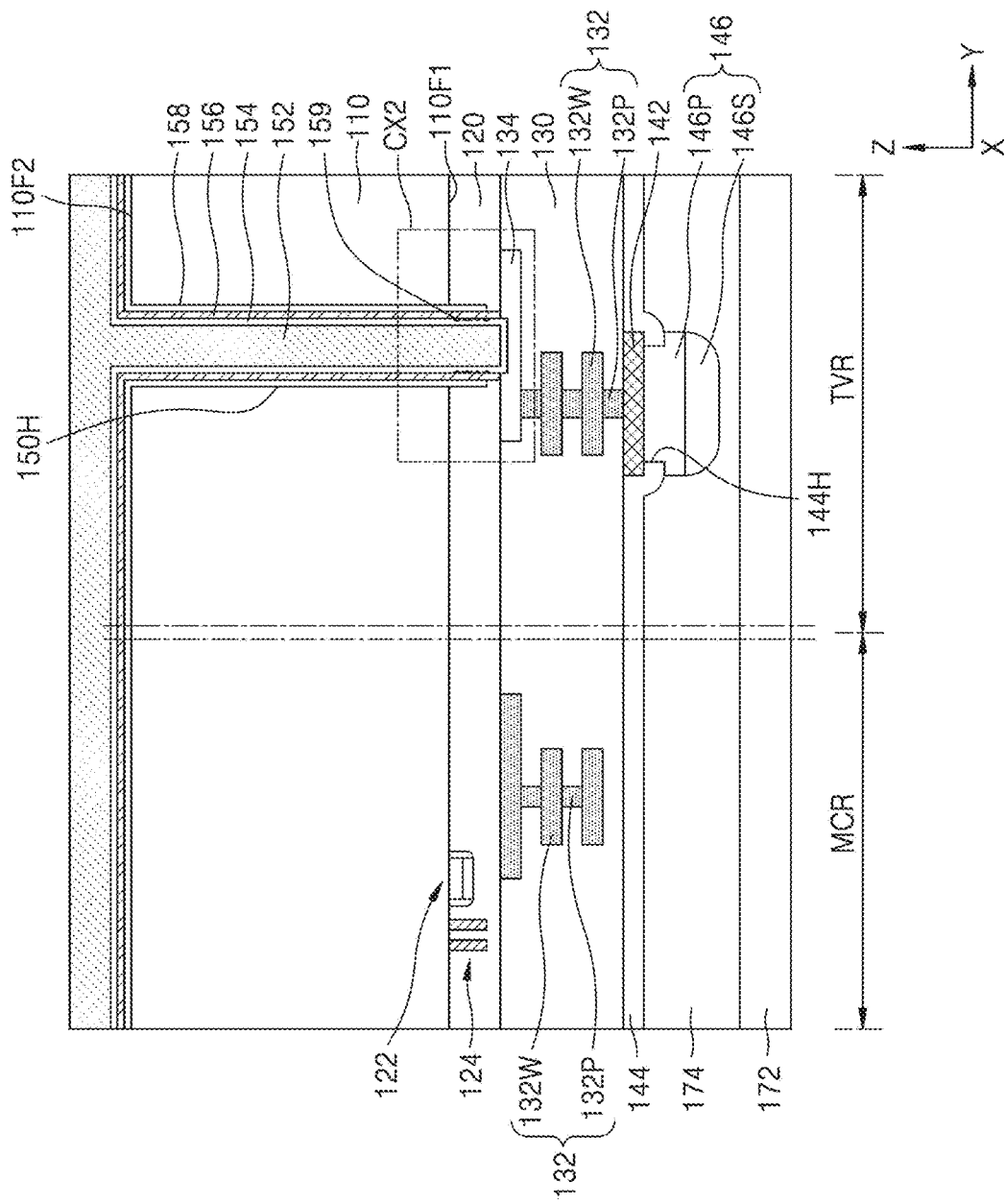

Referring to FIG. 15, the conductive plug 152 may be formed on the first conductive barrier layer 154 to fill the through-via hole 150H. The conductive plug 152 may be formed of Cu, CuSn, CuMg, CuNi, CuZn, CuPd, CuAu, CuRe, CuW, W, or a W alloy and may be formed by an electroplating process. For example, to form the conductive plug 152, a metal seed layer may be formed on a surface of the first conductive barrier layer 154, and then a metal layer may be formed from the metal seed layer by an electroplating process, such that the conductive plug 152 may be formed on the first conductive barrier layer 154 to fill the through-via hole 150H. The metal seed layer may be formed of Cu, a Cu alloy, Co, Ni, Ru, Co/Cu, or Ru/Cu and may be formed by a PVD process. The electroplating process may be performed at a temperature of about 10 to 65° C. As an example, the electroplating process may be performed at a room temperature. In some embodiments, the resulting structure including the conductive plug 152 may be annealed at a temperature of about 150 to 450° C.

Figure 16:
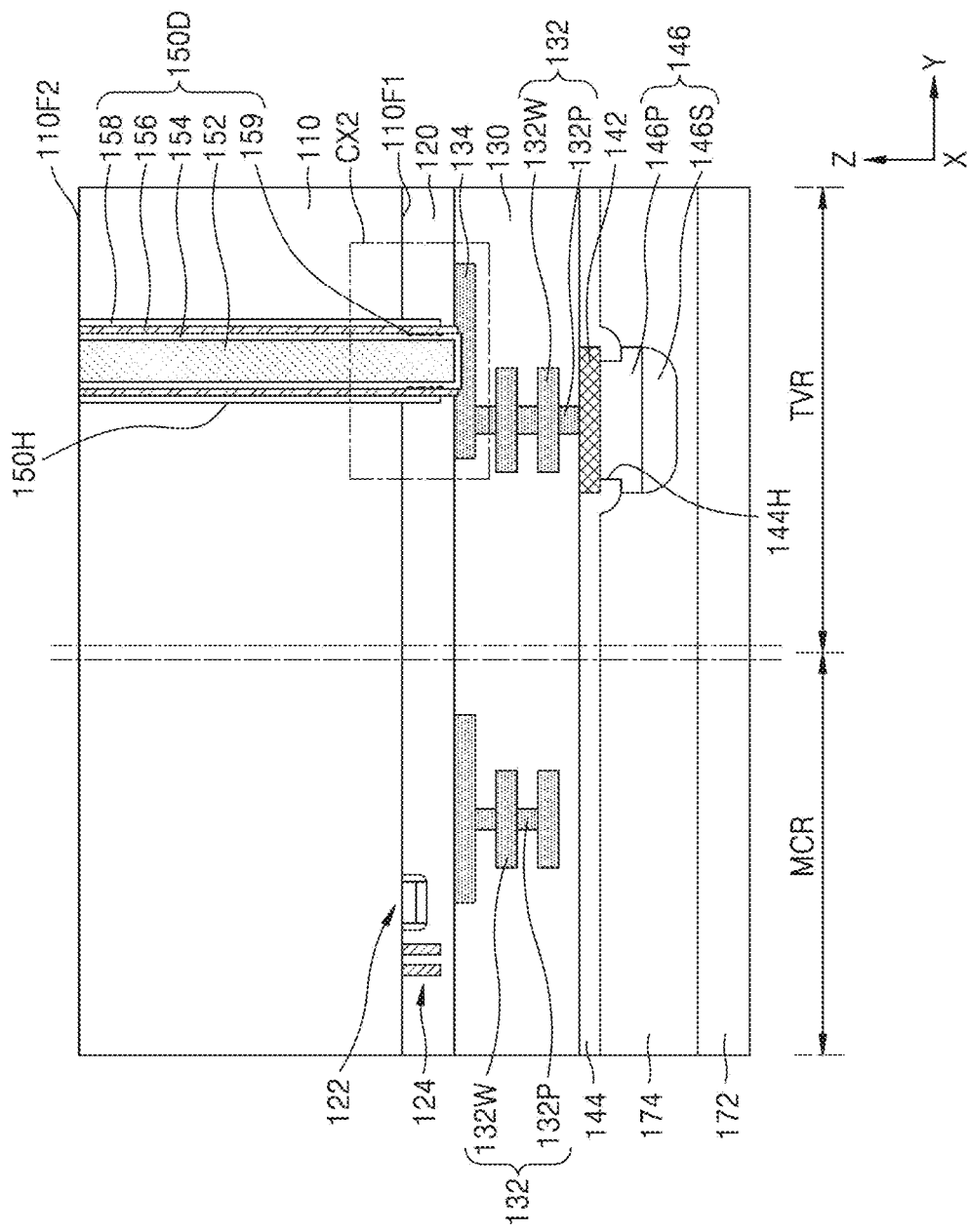

Referring to FIG. 16, the resulting structure including the conductive plug 152 may be polished by a chemical mechanical polishing (CMP) process to expose the second surface 110F2 of the substrate 110, such that the conductive plug 152, the first conductive barrier layer 154, the second conductive barrier layer 156, and the via insulation layer 158 may be left only in the through-via hole 150H. Accordingly, a through-via structure 150D may be formed in the through-via hole 150H.

Referring again to FIG. 2, a conductive layer may be formed on the second surface 110F2 of the substrate 110, and then the conductive layer may be patterned to form the second pad 162. The second pad 162 may be electrically connected to the through-via structure 150D.

According to a method of manufacturing the integrated circuit device 100D described above, after the via insulation layer 158 and the second conductive barrier layer 156 are formed first on the inner surface of the through-via hole 150H, the etch process for exposing the upper surface 134WU of the landing pad metal layer 134W at the bottom of the through-via hole 150H may be performed. Thus, even though the metal particles etched from the landing pad metal layer 134W are redeposited on the sidewall of the through-via hole 150H during the etch process, the metal islands 159 including the metal particles may be disposed between the first conductive barrier layer 154 and the second conductive barrier layer 156. Thus, the metal particles may be limited and/or prevented from contacting the via insulation layer 158. The likelihood that the via insulation layer 158 is contaminated by the metal particles generated during the etch process for forming the through-via hole 150H when the second conductive barrier layer 156 is omitted may be reduced. Accordingly, the reliability of the integrated circuit device 100D may be enhanced.

Figure 17:
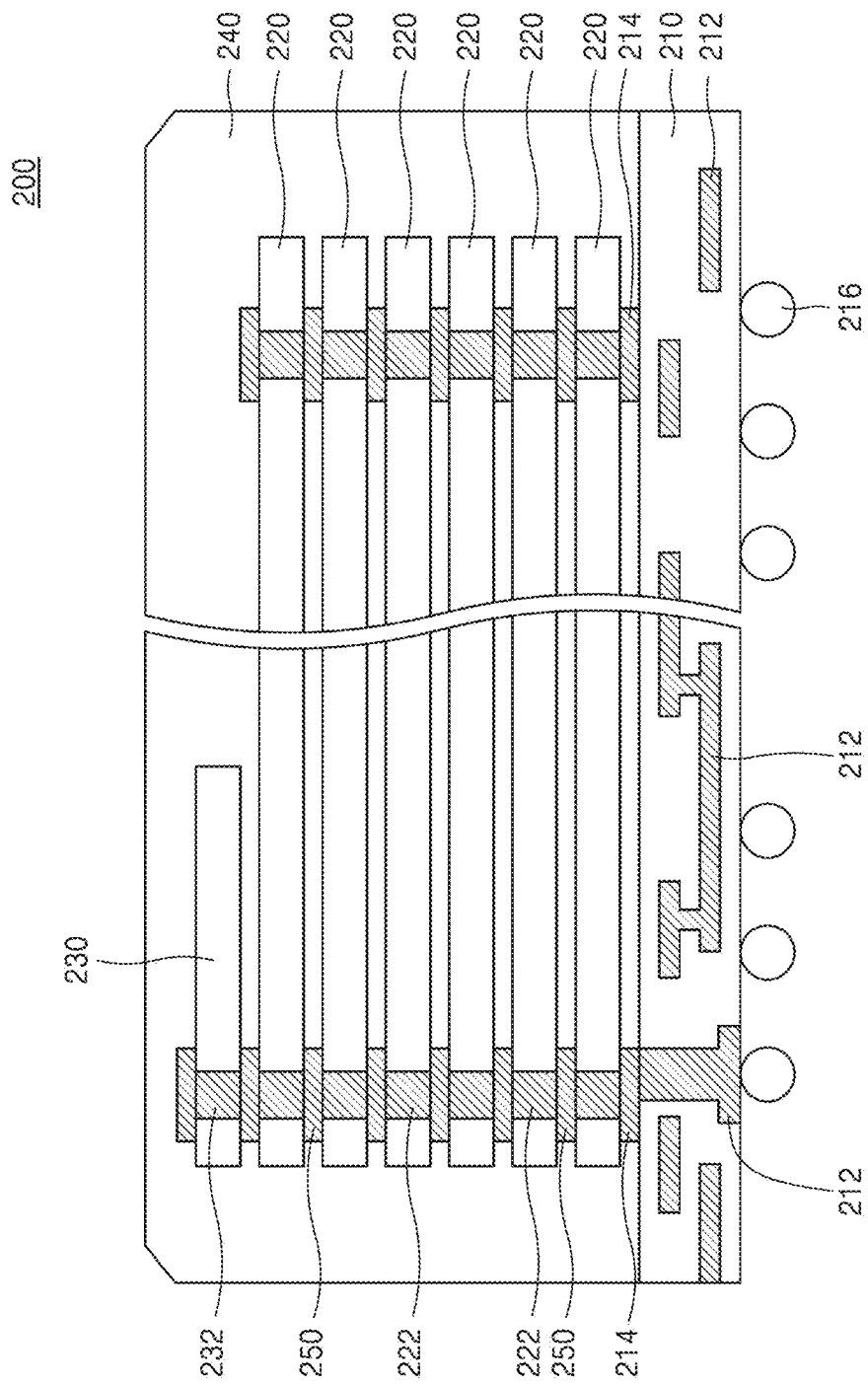
FIG. 17 is a cross-sectional view illustrating a main configuration of a semiconductor package according to example embodiments.

FIG. 17 is a cross-sectional view illustrating a main configuration of a semiconductor package 200 according to example embodiments.

Referring to FIG. 17, the semiconductor package 200 may include a plurality of semiconductor chips 220 sequentially stacked on a package substrate 210. A control chip 230 may be disposed on the plurality of semiconductor chips 220 to be connected to the plurality of semiconductor chips 220. A stack structure of the plurality of semiconductor chips 220 and the control chip 230 may be encapsulated on the package substrate 210 with an encapsulant 240, such as thermosetting resin. As shown in FIG. 17, six semiconductor chips 220 are vertically stacked, but the number and a stack direction of the semiconductor chips 220 are limited thereto. For example, more or less than six semiconductor chips 220 may be stacked. In some embodiments, the plurality of semiconductor chips 220 may be arranged in a horizontal direction. In some embodiments, the plurality of semiconductor chips 220 may be arranged in a horizontal direction and a vertical direction. In some embodiments, the control chip 230 may omitted.

The package substrate 210 may include a flexible printed circuit board, a rigid printed circuit board, or a combination thereof. The package substrate 210 may include a substrate internal wiring 212 and a connection terminal 214. The connection terminal 214 may be formed on a first surface of the package substrate 210. A solder ball 216 may be formed on a second surface of the package substrate 210. The connection terminal 214 may be electrically connected to the solder ball 216 through the substrate internal wiring 212. In some embodiments, the solder ball 216 may be replaced with a conductive bump or a lead grid array (LGA).

The plurality of semiconductor chips 220 and the control chip 230 may include through-silicon-via (TSV) units 222 and 232. The TSV units 222 and 232 may be electrically connected to the connection terminal 214 of the package substrate 210 by a connection part 250, such as a bump. In some embodiments, the TSV unit 232 in the control chip 230 may be omitted.

At least one of semiconductor chips 220 and the control chip 230 may include at least one of the integrated circuit devices 100, 100A, 100B, 100C, and 100D described with reference to FIGS. 1 to 7. The TSV units 222 and 232 may include at least one of the through-via structures 150, 150A, 150B, 150C, and 150D described with reference to FIGS. 1 to 7.

The connection part 250 may include the first pad 142 described with reference to FIG. 2 and the second pad 162, described with reference to FIG. 2, connected to the TSV units 222 and 232 through the first pad 142.

Each of the plurality of semiconductor chips 220 may include a system LSI, a flash memory, a DRAM, an SRAM, an EEPROM, a PRAM, an MRAM, or an ReRAM. The control chip 230 may include logic circuits, such as a serializer/deserializer circuit.

While some inventive concepts have been particularly shown and described with reference to example embodiments thereof, it will be understood by those of ordinary skill in the art that various changes in form and details may be made therein without departing from the spirit and scope of the following claims.

What is claimed is:

1. An integrated circuit device comprising:
    a substrate;
    a landing pad on the substrate; and
    a through-via structure passing through the substrate and connected to the landing pad, the through-via structure including:
        a conductive plug;
        a first conductive barrier layer covering a sidewall of the conductive plug;
        a second conductive barrier layer covering a portion of an outer surface of the first conductive barrier layer; and
        a via insulation layer covering a portion of an outer surface of the second conductive barrier layer;
    wherein the first conductive barrier layer extends further toward the conductive plug than the second conductive barrier layer; and
    wherein the second conductive barrier layer extends further toward the conductive plug than the via insulation layer.

2. The integrated circuit device of claim 1, wherein
    the first conductive barrier layer has a thickness of about 500 to about 2000 Å, and
    the second conductive barrier layer has a thickness of about 500 to about 2000 Å.

3. The integrated circuit device of claim 1, wherein the via insulation layer is spaced apart from the landing pad in a first direction.

4. The integrated circuit device of claim 1, wherein
    a lower surface of the second conductive barrier layer is in contact with the landing pad, and
    a lower portion of a sidewall of the second conductive barrier layer is not covered by the via insulation layer.

5. The integrated circuit device of claim 1, wherein
    the landing pad further includes a landing pad metal layer and a landing pad barrier layer,
    the landing pad metal layer is on the substrate, the landing pad barrier layer is on an upper surface and a sidewall of the landing pad metal layer, a lower surface of the first conductive barrier layer contacts the landing pad metal layer, and a lower surface of the second conductive barrier layer contacts the landing pad barrier layer.

6. The integrated circuit device of claim 5, wherein the lower surface of the first conductive barrier layer is positioned at a first distance from a first surface of the substrate, the lower surface of the second conductive barrier layer is positioned at a second distance from the first surface of the substrate, and the first distance is greater than the second distance.

7. The integrated circuit device of claim 1, further comprising:

an interlayer insulation layer on the substrate; and an inter-metal insulation layer on the interlayer insulation layer and covering the landing pad, wherein a portion of a sidewall of the via insulation layer is covered by the interlayer insulation layer, and a lower surface of the through-via structure contacts the landing pad.

8. The integrated circuit device of claim 7, wherein the substrate and the interlayer insulation layer define a through-via hole that penetrates the substrate and the interlayer insulation layer, the through-via structure is in the through-via hole, and the interlayer insulation layer defines a stepped portion at a bottom of the through-via hole.

9. The integrated circuit device of claim 8, wherein the stepped portion of the through-via hole is defined by a lower surface of the via insulation layer and a sidewall of the second conductive barrier layer.

10. The integrated circuit device of claim 1, wherein the via insulation layer has a thickness of about 500 to about 3000 Å.

11. An integrated circuit device comprising:

a substrate;

a landing pad on the substrate; and a through-via structure passing through the substrate and connected to the landing pad, the through-via structure comprising:

a conductive plug;

a first conductive barrier layer on a sidewall of the conductive plug;

a second conductive barrier layer covering a portion of an outer surface of the first conductive barrier layer; and a via insulation layer covering a portion of an outer surface of the second conductive barrier layer;

wherein the first conductive barrier layer has a thickness of about 500 to about 2000 Å, the second conductive barrier layer has a thickness of about 500 to about 2000 Å, and the via insulation layer has a thickness of about 500 to about 3000 Å.

12. The integrated circuit device of claim 11, wherein the first conductive barrier layer has a first height in a first direction perpendicular to a first surface of the substrate, the second conductive barrier layer has a second height in the first direction, the second height is smaller than the first height, and the via insulation layer has a third height in the first direction, the third height is smaller than the second height.

13. The integrated circuit device of claim 11, wherein a lower surface of the second conductive barrier layer is in contact with the landing pad, and a lower portion of a sidewall of the second conductive barrier layer is not covered by the via insulation layer.

14. The integrated circuit device of claim 11, wherein the landing pad further includes a landing pad metal layer and a landing pad barrier layer, the landing pad metal layer is on the substrate, the landing pad barrier layer is on an upper surface and a sidewall of the landing pad metal layer, a lower surface of the first conductive barrier layer contacts the landing pad metal layer, and a lower surface of the second conductive barrier layer contacts the landing pad barrier layer.

15. The integrated circuit device of claim 14, wherein the lower surface of the first conductive barrier layer is positioned at a first distance from a first surface of the substrate, the lower surface of the second conductive barrier layer is positioned at a second distance from the first surface of the substrate, and the first distance is greater than the second distance.

16. The integrated circuit device of claim 11, further comprising:

an interlayer insulation layer on the substrate; and an inter-metal insulation layer on the interlayer insulation layer and covering the landing pad, wherein a portion of a sidewall of the via insulation layer is covered by the interlayer insulation layer, and a lower surface of the through-via structure contacts the landing pad.

17. The integrated circuit device of claim 16, wherein the substrate and the interlayer insulation layer define a through-via hole that penetrates the substrate and the interlayer insulation layer, the through-via structure is in the through-via hole, the interlayer insulation layer defines a stepped portion at a bottom of the through-via hole, and the stepped portion of the through-via hole is defined by a lower surface of the via insulation layer and a sidewall of the second conductive barrier layer.

18. The integrated circuit device of claim 11, wherein a tip end of the via insulation layer is spaced apart from the landing pad.

19. An integrated circuit device comprising:

a substrate;

a landing pad on the substrate; and a through-via structure passing through the substrate and connected to the landing pad, the through-via structure including:

a conductive plug;

a first conductive barrier layer on a sidewall of the conductive plug;

a second conductive barrier layer covering a portion of an outer surface of the first conductive barrier layer; and a via insulation layer covering a portion of an outer surface of the second conductive barrier layer, and wherein the conductive plug includes Cu, CuSn, CuMg, CuNi, CuZn, CuPd, CuAu, CuRe, CuW, W, or a W alloy.

20. The integrated circuit device of claim 19, wherein the first conductive barrier layer has a first height in a first direction perpendicular to a first surface of the substrate, the second conductive barrier layer has a second height in the first direction, the second height is smaller than the first height, and the via insulation layer has a third height in the first direction, the third height is smaller than the second height.

21. The integrated circuit device of claim 19, wherein the first conductive barrier layer has a thickness of about 500 to about 2000 Å, the second conductive barrier layer has a thickness of about 500 to about 2000 Å, and the via insulation layer has a thickness of about 500 to about 3000 Å.

22. The integrated circuit device of claim 19, wherein a lower surface of the second conductive barrier layer is in contact with the landing pad, and a lower portion of the sidewall of the second conductive barrier layer is not covered the via insulation layer.

23. The integrated circuit device of claim 19, wherein a tip end of the via insulation layer is spaced apart from the landing pad.

* * * * *